United States Patent
Hara et al.

(10) Patent No.: US 6,172,373 B1
(45) Date of Patent: Jan. 9, 2001

(54) STAGE APPARATUS WITH IMPROVED POSITIONING CAPABILITY

(75) Inventors: Hideaki Hara, Yokohama; Yuji Imai, Omiya; Masayuki Murayama, Kanagawa-ken, all of (JP)

(73) Assignee: Nikon Corporation, Tokyo (JP)

( * ) Notice: Under 35 U.S.C. 154(b), the term of this patent shall be extended for 0 days.

(21) Appl. No.: 09/419,771

(22) Filed: Oct. 18, 1999

Related U.S. Application Data

(63) Continuation of application No. 08/917,602, filed on Aug. 26, 1997, now abandoned.

(30) Foreign Application Priority Data

| Aug. 27, 1996 | (JP) | 8-225474 |
| Aug. 29, 1996 | (JP) | 8-247162 |

(51) Int. Cl.[7] ................................. G01N 21/86
(52) U.S. Cl. ..................... 250/548; 356/401; 355/53
(58) Field of Search .......................... 250/548; 355/53, 355/55; 356/399–401

(56) References Cited

U.S. PATENT DOCUMENTS

| 4,084,903 | 4/1978 | Pircher | 355/53 |
| 4,383,757 | 5/1983 | Phillips | 355/53 |
| 4,558,949 | 12/1985 | Uehara et al. | 356/152 |
| 4,849,901 | 7/1989 | Shimizu | 364/468 |
| 4,978,841 | 12/1990 | Barrett et al. | 250/548 |
| 5,015,866 | 5/1991 | Hayashi | 250/548 |
| 5,114,234 | 5/1992 | Otsuka et al. | 356/358 |
| 5,151,749 | 9/1992 | Tanimoto et al. | 250/548 |
| 5,424,552 | 6/1995 | Tsuji et al. | 250/548 |
| 5,448,332 | 9/1995 | Sakakibara et al. | 355/53 |
| 5,461,237 * | 10/1995 | Wakamoto et al. | 250/548 |
| 5,635,722 | 6/1997 | Wakamoto et al. | 250/548 |
| 5,654,553 | 8/1997 | Kawakubo et al. | 355/53 |
| 5,783,833 | 7/1998 | Sugaya et al. | 356/401 |
| 5,796,467 | 8/1998 | Suzuki | 355/53 |
| 5,825,043 | 10/1998 | Sawa | 355/55 |

FOREIGN PATENT DOCUMENTS

| 58-103136 | 1/1991 | (JP) . |
| 63-16418 | 7/1992 | (JP) . |

* cited by examiner

*Primary Examiner*—Stephone B. Allen
(74) *Attorney, Agent, or Firm*—Morgan, Lewis & Bockius LLP

(57) ABSTRACT

An exposure apparatus comprises a projection optical system, which projects a pattern formed on a mask on a photosensitive substrate, a mounting object table, which holds the photosensitive substrate, a positioning stage, which positions the mounting object table along a 2-dimensional movement coordinate system, a stage coordinate measurement device, which detects the position of the mounting object table in the 2-dimensional movement coordinate system, a height measurement device, which detects the deviation in the optical axis direction of the projection optical system from the surface of the photosensitive substrate to a specified standard surface in a measurement point fixed with regard to the 2-dimensional movement coordinate system, a levelling device, which adjusts the inclination of the mounting object table with regard to the positioning stage, a computation device, which calculates the amount of levelling necessary to match the surface of the photosensitive substrate with the standard surface, a control device, which controls the levelling device based on the calculation results of the computation device, and a memory device, which stores the optical axis direction displacement amount of the mounting object table produced at a measurement point when the positioning stage is moved along the 2-dimensional movement coordinate system corresponding to the position of the mounting object table detected by the stage coordinate measurement device, wherein, the computation device calculates the amount of the levelling necessary based on a value obtained by subtracting the optical axis direction displacement amount of the mounting object table stored in the memory device from the deviation detected by the height measurement device.

33 Claims, 13 Drawing Sheets

といStage Apparatus With Improved Positioning Capability

STAGE APPARATUS WITH IMPROVED POSITIONING CAPABILITY

This is a continuation of application Ser. No. 08/917,602 filed on Aug. 26, 1997, now abandoned.

This application claims the benefit of Application Nos.: 8-247162, filed in Japan on Aug. 29, 1996 and 8-225474, filed in Japan on Aug. 27, 1996, which are hereby incorporated by reference.

BACKGROUND OF THE INVENTION

1. Field of the Invention

The present invention concerns an exposure apparatus used in photolithography processes in the manufacture of semiconductor devices, liquid crystal display devices, etc., and in particular concerns an exposure apparatus provided with a levelling device for matching the surface of the photosensitive substrate with the image formation plane of the projection optical system.

The present invention also concerns a stage apparatus, more specifically, a stage apparatus which is provided with a No. 1 stage which is able to move in a specified direction along a guidance plane over an antivibration stage which is held horizontally via antivibration pads, and a No. 2 stage which is mounted on this No. 1 stage and can be tilt-driven. The stage apparatus of the present invention can be used effectively as a stage for the positioning of photosensitive substrates in exposure devices, etc.

2. Discussion of the Related Art

In the past, in the manufacture of semiconductor devices, liquid crystal display elements, etc., using photolithographic techniques, an exposure apparatus has been used in which a pattern formed on a photomask (hereinafter referred to as mask) or reticle is projected and exposed on each shot area of a photosensitive substrate such as a semiconductor wafer or glass plate, etc., which has been coated with a photosensitive agent such as photoresist via a projection optical system. As an exposure apparatus, a so-called step-and-repeat type exposure apparatus, wherein the photosensitive substrate is mounted on a substrate stage which is moveable in two dimensions, and the operation of exposing the pattern image of the mask on each shot area of the photosensitive substrate is repeated by stepping the photosensitive substrate using this substrate stage, and, in particular, reductive projection type exposure apparatuses have often been used. Also, step-and-scan type exposure apparatuses have been used in which pattern exposure is performed on each shot area of the photosensitive substrate by reductive projection and, by means of a scanning exposure system, movement is performed between the shot areas in a stepping mode.

In general, since a projection optical system which has a large numerical aperture and a shallow focal depth is used in the exposure apparatus, in order to transcribe a fine pattern with high resolution, levelling control, whereby the angle of inclination of the photosensitive substrate surface is matched so as to be parallel with the angle of inclination of the image formation plane of the projection optical system, and autofocus control, whereby the height (focal point position) of the surface of the photosensitive substrate is matched with the position of the image formation plane of the projection optical system are necessary.

In order to perform levelling control, it is necessary to measure accurately the average inclination amount of local parts of or the entire photosensitive substrate surface. In the past, various such measurement methods have been proposed, for example, in Japanese Examined Patent No. [Kokoku] Hei 3-5652, Tokko Hei 4-42601, U.S. Pat. Nos. 4,084,903, 4,383,757, etc. For example, the height position in the optical axis direction (Z direction) is measured on at least 3 points on the photosensitive substrate using a gap sensor such as an air micrometer, an approximate plane formula of the photosensitive substrate surface is specified based on the measurement values thereof, and a levelling mechanism provided on the substrate stage is driven so that the approximate plane matches the image formation plane of the projection optical system.

Also, in the past, in shot areas existing on the peripheral area of the photosensitive substrate, which are shot areas for which autofocus control is difficult due to the scattering of the focal point position detection light, etc., exposure is performed in the focal point position of the shot area which is adjacent to this shot.

The sensor which measures the height position of the photosensitive substrate in the Z direction is fixed on the apparatus main body and is unable to move. Accordingly, in order to measure the Z direction positions of several points on the photosensitive substrate surface, the photosensitive substrate is moved by means of the substrate stage, and the multiple points on the photosensitive substrate are taken to the measurement point of the sensor in sequence. For this reason, when the running of the substrate stage itself carries a displacement amount in the Z direction, the Z direction displacement of the photosensitive substrate surface caused by the running of the substrate stage and the Z direction displacement within the plane of the photosensitive substrate cannot be separated, so that even if the surface of the photosensitive substrate itself is perpendicular to the Z direction, it may be judged that the photosensitive substrate surface is inclined, creating the problem that the levelling operation will be performed in error.

Problems in conventional levelling control are explained referring to FIG. 13. Here, the action of performing levelling control based on sensor measurement values having measurement points in the positions indicated by the broken line are explained making the running direction of the substrate stage the X direction and the direction parallel to the optical axis the Z direction. FIGS. 13(a) through (c) consists of diagrams explaining the concept of levelling control in the case where there is no displacement of the substrate stage running in the Z direction and FIGS. 13(d) through (f) consists of diagrams explaining the concept of levelling control when the running of the substrate stage has displacement in the Z direction.

Assuming that the surface $SF_1$ of the photosensitive substrate 80 is inclined as shown in FIG. 13(a). First, the photosensitive substrate is positioned in the position indicated by the solid line by means of the movement of the substrate stage (85) and the height position of point $P_1$ of the photosensitive substrate surface $SF_1$ is measured. The X coordinate of point $P_1$ is $X_1$, and the height measurement position at this time is made $Z_1$. Next, the photosensitive substrate (80) is moved to a different position on an imaginary line as indicated by the arrow by the movement of the substrate stage and the height position of another point $P_2$ on the photosensitive substrate surface $SF_1$ is measured. The X coordinate of point $P_2$ is made $X_2$, and the height measurement value is made $Z_2$.

From the coordinate values $(X_1, Z_1)$ of point $P_1$ and the coordinate values $(X_2, Z_2)$ of point $P_2$ at this time, the exposure apparatus recognizes that the surface $SF_1$ of the photosensitive substrate is inclined as shown in FIG. 13(b). Accordingly, as shown in FIG. 13(c), levelling control is performed so that the mounting object table 81 upon which the photosensitive substrate 80 is mounted is inclined by operating the levelling mechanisms 82a, 82b of the substrate stage, and the surface $SF_1$ of the photosensitive substrate 80 becomes horizontal. In this way, if the running of the substrate stage 85 becomes displaced in the Z direction, a conventional exposure apparatus can perform suitable levelling control based on the height measurement values.

On the other hand, when, as indicated by the wavy imaginary line in FIG. 13(d), the running of the substrate stage 85 has displacement in the Z direction, a conventional exposure apparatus cannot perform levelling control. It is assumed, as shown in FIG. 13(d), that the photosensitive substrate 87 has no inclination within the plane. Initially, the photosensitive substrate 87 will be positioned as indicated by the solid line by the movement of the substrate stage 85, and the height position of point $P_3$ of the photosensitive substrate surface $SF_2$ is measured. Here it is assumed that the X coordinate of point $P_3$ is $X_3$, and the height measurement value at this time is $Z_3$. Next, the photosensitive substrate 87 is moved by the movement of the substrate stage up to a position indicated by the broken line as shown by the arrows, and the height of another point $P_4$ on the photosensitive substrate surface $SF_2$ is measured. At this time, since the running of the substrate stage 85 has displacement in the Z direction, the photosensitive substrate 87 is moved in the Z direction as well, and the measurement value of the height of point $P_4$ is assumed to become $Z_4$. The X coordinate of point $P_4$ is $X_4$.

At this time, from the coordinate values $(X_3, Z_3)$ of point $P_3$ and the coordinate values $(X_4, Z_4)$ of point $P_4$, the exposure apparatus recognizes that the surface $SF_2$ of the photosensitive substrate is inclined as indicated in FIG. 13(e), despite the fact that it is actually horizontal. Accordingly, control is performed so that the levelling mechanism 82a, 82b of the substrate stage 85 are operated, the mounting object table 81 upon which the photosensitive substrate 87 is mounted is tilted, and the height position $Z_3$ of point $P_3$ and the height position $Z_4$ of point $P_4$ are made equal. As a result, as shown in FIG. 13d, faulty levelling control is performed, and the surface $SF_2$ of the photosensitive substrate 87 ceases to be horizontal.

Also, in conventional exposure apparatuses, in shots in the peripheral area of the photosensitive substrate, when exposure is performed in the focal point position of the adjacent shot without detecting the focal point position in the exposure position, even if there is change in the Z direction due to the running of the substrate stage, there is a problem that error due to displacement of the focal point position will result because focal point position correction has not been performed.

In the past, in the manufacture of semiconductor elements or liquid crystal display elements, etc., by photolithographic processes, an exposure apparatus has been used wherein the image of a pattern formed on a mask or reticle is transferred via a projection optical system onto an exposure target substrate such as a wafer or glass plate. In this type of exposure apparatus, a stage apparatus is used wherein a sample stage in which movement of 3 axes, movement in the up-down direction (Z), rotation around the X axis, and rotation around the Y axis, or on 4 axes, adding rotation on a Z axis is mounted on an XY stage which is able to move within a 2-dimensional plane in perpendicular biaxial directions (normally the XY biaxial directions). In this case, the sample stand as a result can have positional and attitude control of 5 degrees of freedom or 6 degrees of freedom, and the position of the sample stand in the XY 2-dimensional direction is measured with high accuracy by means of a lightwave interferometer, generally a laser interferometer, via a reflecting mirror (moving mirror) fixed on the sample stand. Furthermore, a light source, reticle stage, projection optical system, reflecting mirror (fixed mirror) which forms the light generating part and standard of the laser interferometer, a focus detection system, which measures positional displacement of the focal planes of the exposure target substrate and projection optical system in the optical axis direction, and a leveling detection system, which measures the inclination of the exposure target substrate and focal plane (image formation plane), etc., are mounted on a stand to which the stage base is rigidly connected.

At the time of exposure, the XY stage is moved 2-dimensionally in the XY plane, the exposure position (shot region) of the exposure target substrate is positioned in the pattern projection position of the projection optical system, and next, or at the same time as the XY movement, the sample stand is Z-driven based upon the measurement results of the focus detection system so as to enter the region of the focal depth of the projection optical system, simultaneously the inclination of the sample stand is adjusted based upon the measurement to results of the leveling detection system so that the exposure target substrate and image formation plane will be parallel, and when all deviations have entered allowable levels, exposure is performed.

When the inclination of the exposure target substrate surface and image formation plane are matched, the sample stand is tilted, but since the moving mirror is also tilted together with the sample stand at this time, the angle formed by the laser beam optical axis from the interferometer and the moving mirror reflecting face changes. Specifically, the laser beam is no longer perpendicularly incident to the moving mirror reflecting face, and as a result error is produced in the XY coordinates of the sample stand as measured by the laser interferometer.

The principal error is generally referred to as Abbe error and cosine error, and when the difference in height between the interferometer beam and the exposure target substrate surface is "h" and the distance in a specified measurement direction, for example, the X direction, between the moving mirror reflecting face and the exposure position is "S," and the amount of change in the inclination in the Y axis of the sample stand with regard to the interferometer laser optical axis is "α," the X direction error Err can be represented as $$Err = Abbe\ error + cosine\ error = h \times \alpha + S \times (1 - \cos\alpha).$$

In the past, the error has been obtained by means of calculation assuming the inclination θ of the sample stand that has been detected by the measurement device mounted on the XY stage as being the same as the α, and error has been eliminated by correcting the position of the XY stage or the position of the reticle.

Nevertheless, when the XY stage is moved in the X direction or Y direction, depending upon errors in flatness, etc., in the guidance plane, rotation around the X axis or the Y axis can occur in the XY stage, and since the inclinations θ and α cannot be said to match in a strict sense, as the positioning precision of the exposure target substrate becomes more and more strict, the position measurement error of the laser interferometer caused by this difference between θ and α has come to be a problem.

Moreover, in precision equipment such as normal exposure apparatuses, etc., because of the necessity for insulation of the effects of vibration from the setting floor on a microgram scale, the fixed base upon which the XY stage and its stage base are mounted is held horizontally by means of antivibration pads, so that there is some inclination of the fixed base with regard to an absolute standard due to the movement of the center of gravity accompanying movement of the XY stage, in such cases, the necessity arises to position the XY stage taking into consideration the effects of this inclination as well.

SUMMARY OF THE INVENTION

Accordingly, the present invention is directed to an exposure apparatus that substantially obviates one or more of the problems due to limitations and disadvantages of the related art.

The present invention was produced in light of these problems in the prior art and has the object of offering an exposure apparatus which is able to perform levelling without being affected by displacement in the Z direction due to running of the substrate stage. The present invention also has the purpose of offering an exposure apparatus which is able to perform exposure with regard to shots on the photosensitive substrate periphery without the occurrence of focal point displacement.

According to the present invention, since levelling control can be performed eliminating the influence of Z direction displacement of the photosensitive substrate caused by running of the substrate stage, high precision levelling control becomes possible, and increased yield in device manufacturing can be designed. Moreover, since the Z direction displacement amount can be predicted when the substrate stage shifts in 2-dimensional directions, correction in the Z direction can be performed with high speed and high accuracy. Furthermore, in peripheral areas, etc., of the photosensitive substrate, highly accurate focusing can be performed even in cases when exposure is performed using the focal point detection position of the adjacent shot area.

In the present invention, the purposes are achieved by measuring in advance the Z direction displacement caused by the running of the substrate stage and storing this in a memory. The main cause of this type of Z direction displacement due to running of the substrate stage is manufacturing error in the stage materials, and the Z direction displacement in an arbitrary coordinate point on the XY plane in which this is a factor is stable over a long period of time. Therefore, using a standard substrate, etc., for which the degree of parallelism of the front and back surfaces is already known, the Z direction displacement based on the running of the substrate stage is measured for multiple points on the XY plane in advance and stored in a memory. Since the Z direction position of the substrate stage in the XY plane varies in each apparatus, it is necessary to perform this measurement for each apparatus. Also, by subtracting the Z direction deviation of the substrate stage stored with regard to the XY coordinates of multiple measurement points on the photosensitive substrate from the height positions of these points as actually measured while moving the substrate stage, the true inclination of the photosensitive substrate surface can be obtained, and levelling control is performed based on this inclination.

The present invention also concerns a stage apparatus wherein the sample stage can be positioned accurately in a target position even when a difference occurs in the relative angle of the measurement beam optical axis and the moving mirror reflecting face, without being subject to the effect thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an exposure apparatus includes a projection optical system, which projects a pattern formed on a mask on a photosensitive substrate, a mounting object table, which holds the photosensitive substrate, a positioning stage, which positions the mounting object table along a 2-dimensional movement coordinate system, a stage coordinate measurement device, which detects the position of the mounting object table in the 2-dimensional movement coordinate system, a height measurement device, which detects the deviation in the optical axis direction of the projection optical system from the surface of the photosensitive substrate to a specified standard surface in a measurement point fixed with regard to the 2-dimensional movement coordinate system, a levelling device, which adjusts the inclination of the mounting object table with regard to the positioning stage, a computation device, which calculates the control amount of the levelling device necessary to match the surface of the photosensitive substrate with the standard plane, and a control device, which controls the levelling device based on the computation results of the computation device, the exposure apparatus characterized by the fact that a memory device, which stores the optical axis direction displacement amount of the table produced at the measurement point when the positioning stage is moved along the 2-dimensional movement coordinate system corresponding to the position of the mounting object table measured by the stage coordinate measurement device is provided, and the computation device calculates the control amount of the levelling device based on a value obtained by subtracting the optical axis direction displacement amount of the mounting object table stored in the memory device from the measurement value in accordance with the height measurement device.

Measuring the amount of deviation in the Z direction due to the running of the substrate stage itself in this way and storing it in the apparatus in advance, when the Z direction height is measured at multiple points within the plane of the photosensitive substrate, measurement values can be obtained from which the height deviation amount caused by the running of the substrate stage has been eliminated. For this reason, the levelling control of the photosensitive substrate can be performed more accurately.

Also, by providing a device which calculates the focal point position based on the focal point position with regard to adjacent shots and the amount of deviation of the mounting object table in the optical axis direction which has been stored in the memory device, even in shot areas in the periphery of the photosensitive substrate where the focal point has not been detected, more accurate tilt correction and focal point positioning is possible.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
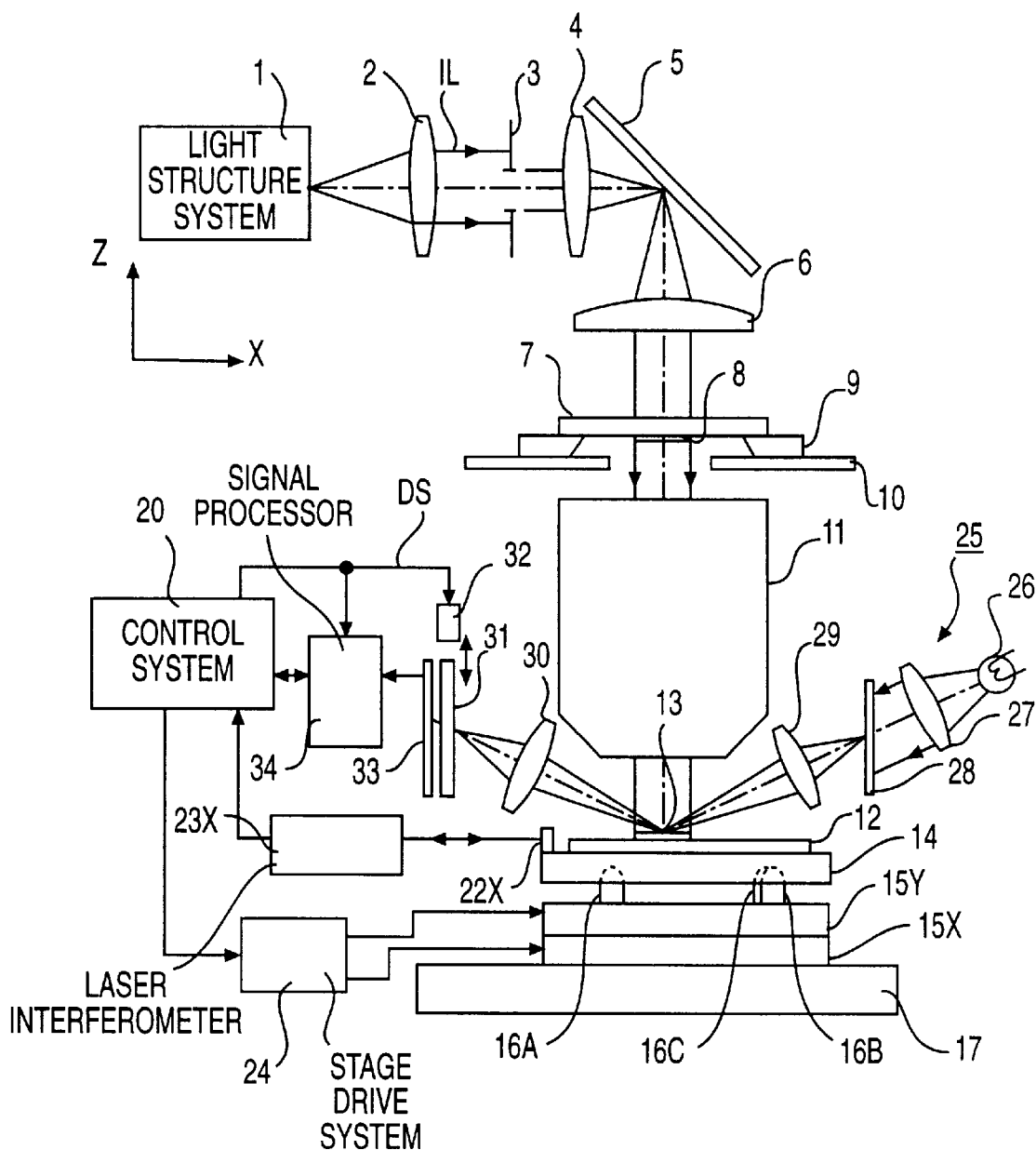
FIG. 1 is a schematic diagram of an example of an exposure apparatus in accordance with the present invention.

FIG. 1 is a schematic diagram of one example of an exposure apparatus in accordance with the present invention. Illumination light IL for exposure from a light source system 1 including a light source, such as an excimer laser or mercury lamp which projects DUV light and an optical integrator, etc., illuminates the pattern of a mask 7 in a uniform intensity distribution via a No. 1 lens 2, a mask blind (variable field aperture) 3, No. 2 lens 4, mirror 5, and main condenser lens 6. The alignment position of the mask blind 3 is nearly conjugate with the pattern formation plane of the mask 7, and the position and form of the illumination area 8 on the mask 7 is determined by the position and form of the opening of the mask blind 3. The mask 7 is held on a mask stage 9.

By means of a projection optical system 11 the pattern image of the mask 7 is projected and exposed on the shot area 13 of the photosensitive substrate 12, which is coated with a photoresist. Here, the Z axis is extended parallel to the optical axis of the projection exposure system 11, the X axis parallel to the paper plane in FIG. 1 within the 2-dimensional plane perpendicular to that optical axis, and the Y axis perpendicular to the paper plane in FIG. 1.

The photosensitive substrate 12 is held on a mounting object table 14 via a photosensitive substrate holder not shown in the figure. The mounting object table 14 is mounted on a positioning stage which can move freely within the XY coordinate system via 3 actuators 16A through 16C, which move in the Z direction. The positioning stage is composed of a Y stage 15Y and X stage 15X, and the Y stage 15Y is mounted so as to be able to move in the Y direction in a feeding screw mode, for example, on the X stage 15X. The X stage 15X is mounted on the apparatus base 17 so as to be able to move in the X direction in a feeding screw mode, for example. By extending or retracting the 3 actuators 16A through 16C in parallel, adjustment of the position of the mounting object table 14 in the Z direction (focal point position) is performed, and by adjusting the extension or retraction amount of the three actuators 16A through 16C individually, the angle of inclination of the mounting object table 14 around the X axis and Y axis is adjusted.

Also, by means of an X axis moving mirror 22X, which is fixed to the upper end of the mounting object table 14, and an external laser interferometer 23X, the X coordinates of the photosensitive substrate 12 are constantly monitored, and similarly, by means of a Y axis moving mirror 22Y and external laser interferometer 23Y (see FIG. 7), the Y coordinates of the photosensitive substrate 12 are constantly monitored, and the X coordinates and Y coordinates detected are supplied to the main control system 20. Based on the coordinates supplied, the main control system 20 controls the operation of the X stage 15X, Y stage 15Y, and mounting object table 14 through the substrate stage drive system 24.

An example of the configuration of the actuator 16A through 16C will now be explained with regard to FIG. 6 which shows a cross-sectional diagram of the actuator 16A. A drive mechanism housing 40 is fixed on the Y stage 15Y in FIG. 1, a feeding screw 41 is housed inside the drive mechanism housing 40 so as to be able to turn, a rotor encoder 43 for rotational angle detection is connected to the left end of the feeding screw 41 via a coupling 42, and a rotary motor 45 is connected to the right end of the feeding screw 41 via a coupling 44. Also, a nut 39 is screwed onto the feeding screw 41, an inclined plane part 36A having the upper end inclined is fixed to the nut 39 via a support column 38, and the rotor 36B is in contact with the upper end of the inclined plane part 36A. The rotor 36B is embedded so as to be able to turn within the mounting object table 14 in FIG. 1 and to be unable to move in the lateral direction.

Also, the inclined plane part 36A is held so that it is able to move in a direction parallel to the feeding screw 41 along a linear guide 37. The drive control signal from the substrate stage control system 24 in FIG. 1 is supplied to the rotary motor 45 and the rotary motor 45 receives the control signal and turns the feeding screw 41. By this means, the nut 39 is moved in the X direction along the feeding screw 41 and the inclined plane part 36A also moves along the feeding screw 41. Accordingly, the rotor 36B, which is in contact with the upper end of the inclined plane part 36A, is displaced in the upper or lower direction (Z direction) with regard to the drive mechanism housing 40 while rotating. Also, by measuring the rotational angle of the feeding screw 41 by means of the rotary encoder 43, the displacement amount of the rotor 36B in the up-down direction is detected. The other actuators 16B and 16C have a similar structure.

Figure 6:
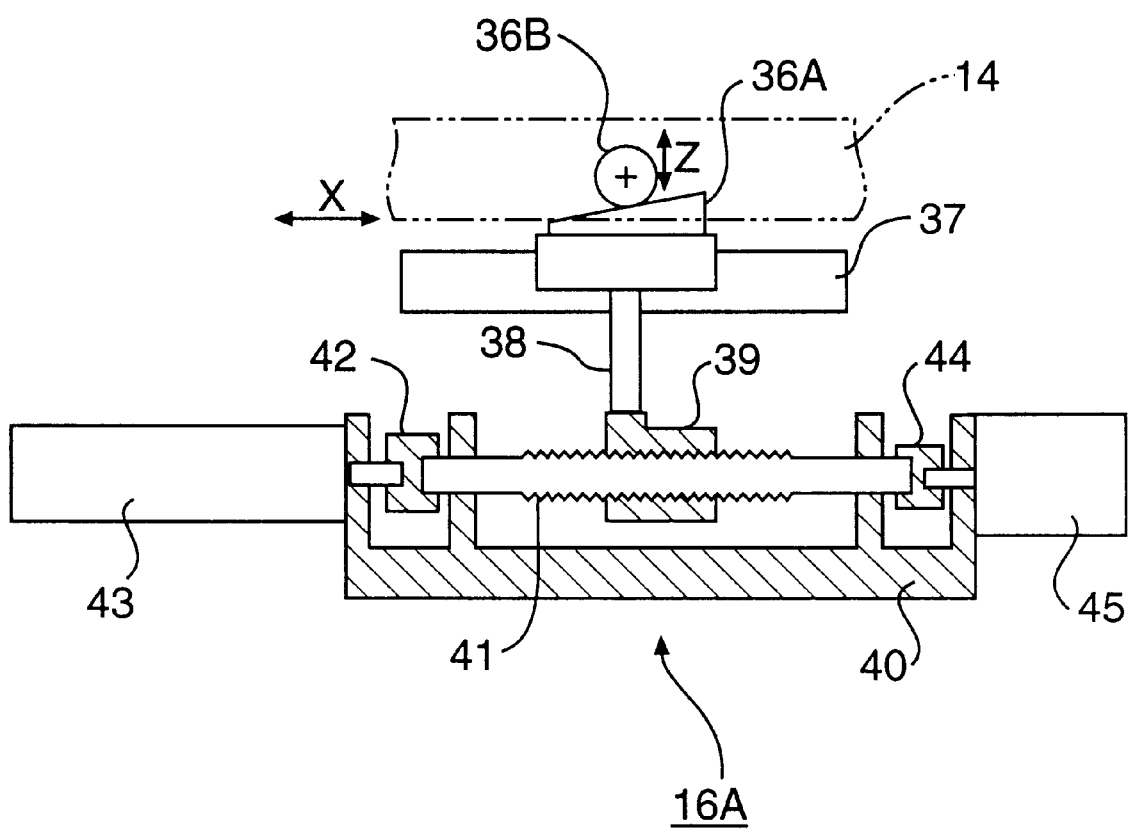
FIG. 6 is a cross-sectional diagram of an actuator.

The actuators 16A through 16C, in addition to the mode which uses a rotary motor as shown in FIG. 6, may also be constituted so as to use, for example, a laminated piezoelectric element (piezo element), etc. When drive elements which are linearly displaced are used as the actuator 16A through 16C in this way, an optical type or electrostatic capacity type, etc., linear encoder can be used as the encoder for detecting the position in the Z direction.

Next, returning to FIG. 1, the constitution of the multipoint focal point position detection system (hereinafter referred to as "multipoint AF sensor") 25, which detects the position of the surface of the photosensitive substrate 12 in the Z direction (focal point position) will be explained. Detection light having non-photosensitivity with regard to the photoresist is projected from the light source 26 of the multipoint AF sensor 25. The detection light illuminates multiple slits inside the light transmission slit plate 28 via the condenser lens 27, and the images of these slits are projected via the object lens 29 onto nine measurement points $P_{11}$ through $P_{33}$ on shot areas 13 on the photosensitive substrate 12 diagonal to the optical axis of the projection optical system 11. At this time, when the surface of the photosensitive substrate 12 is in the best image formation plane of the projection optical system 11, the images of the slits of the light transmission slit plate 28 are formed on the surface of the photosensitive substrate 12 by the object lens 29.

Figure 2:
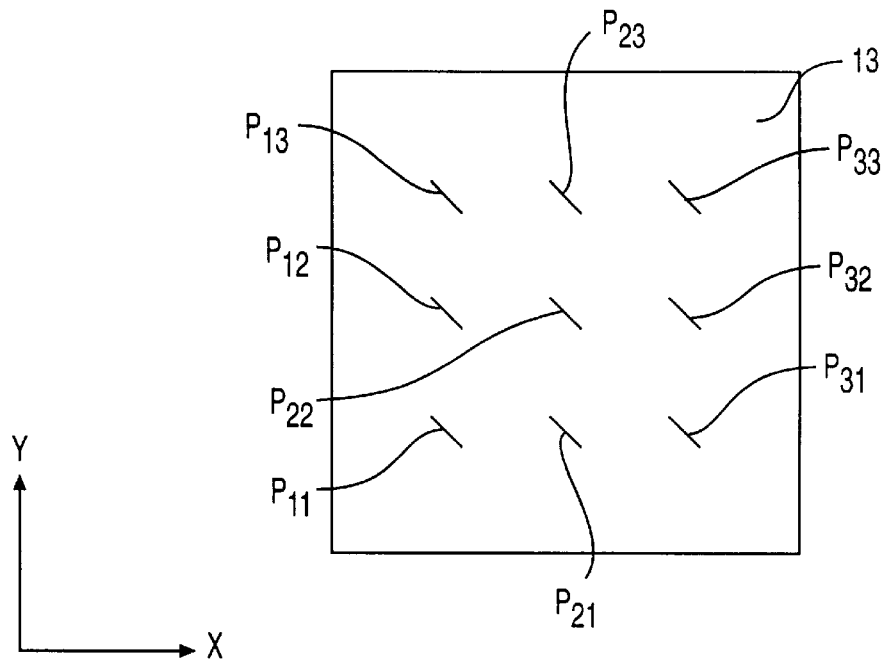
FIG. 2 is a diagram showing the arrangement of measurement points on a photosensitive substrate in accordance with a multipoint AF system.

FIG. 2 shows the arrangement of measurement points on the photosensitive substrate 12; as shown in the figure, total of nine measurement points $P_{11}$ through $P_{33}$, 3 rows×3 columns, are set within the shot area 13. Here, the average shot position within the shot area 13 is obtained from the information of the focal point positions at the nine measurement points within the shot area 13.

Returning to FIG. 1, the reflected light from these measurement points is condensed on a vibrating slit plate 31 via a condenser lens 30, and the slit images projected on these measurement points are again formed on the vibrating slit plate 31. The vibrating slit plate 31 is vibrated in a specified direction by means of a vibrator 32 which is driven by means of a drive signal DS from the main control system 20. The light passing through the multiple light slits of the vibrating slit plate 31 undergoes photoelectric conversion by means of multiple photoelectric conversion elements on the photoelectric detector 33, and these photoelectric conversion signals are supplied to a signal processing system 34, and are supplied to the main control unit 20 after signal processing.

Figure 3:
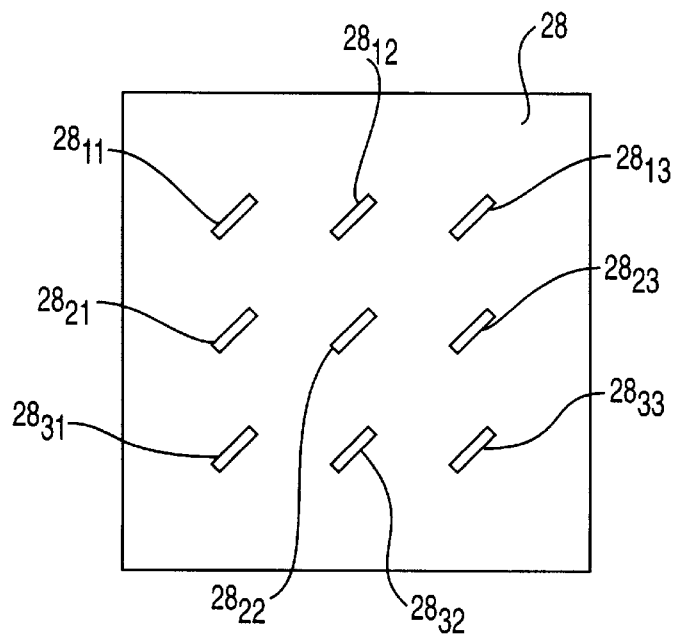
FIG. 3 is a schematic diagram of a light transmission slit plate.
Figure 4:
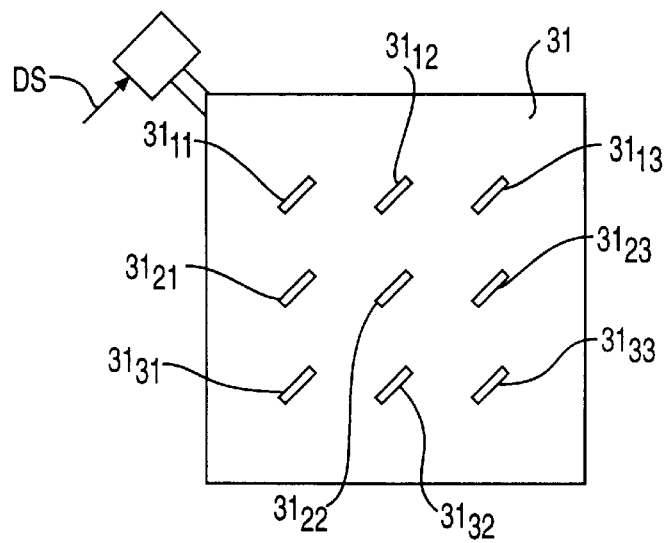
FIG. 4 is a schematic diagram of a vibrating slit plate.

FIG. 3 is a schematic diagram of the light transmission slit plate 28 in FIG. 1. In the light transmission slit plate 28, slits $28_{11}$ through $28_{33}$ are formed in positions corresponding to the measurement points $P_{11}$ through $P_{33}$, respectively, on the photosensitive substrate in FIG. 2. Also, as shown in FIG. 4, slits $31_{11}$ through $31_{33}$ are formed in positions corresponding to the measurement points $P_{11}$ through $P_{33}$ on the photosensitive substrate in FIG. 2 in the vibrating slit plate 31 in FIG. 1 as well, and the vibrating slit plate 31 is vibrated by means of a vibrator 32 in a measurement direction perpendicular to the longitudinal direction of the slits.

Figure 5:
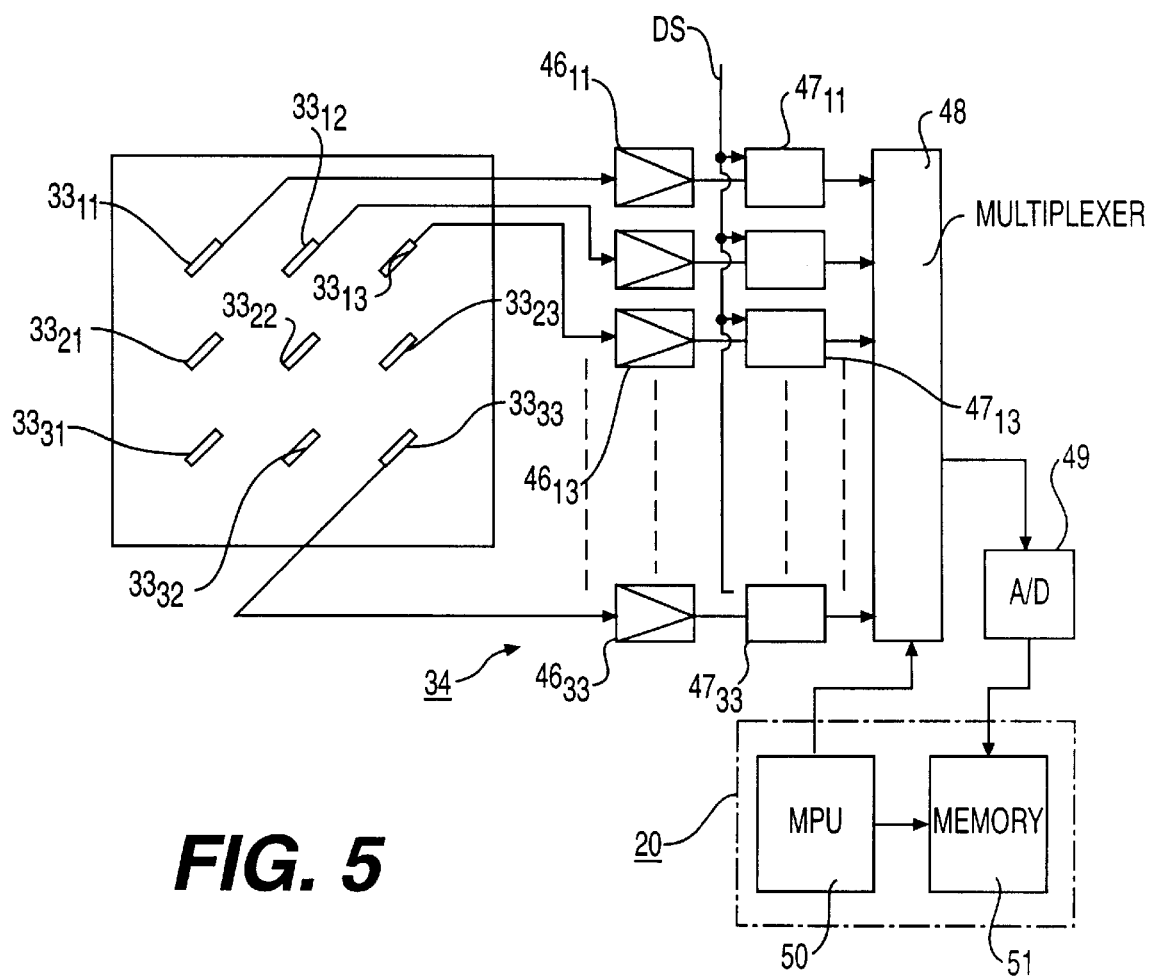
FIG. 5 is a diagram showing a photoelectric detector and signal processing system.

FIG. 5 is a diagram showing the photoelectric detector 33 and signal processing system 34 in FIG. 1. Light reflected from the measurement points $P_{11}$ through $P_{13}$ in FIG. 2 and passing through the corresponding slits in the vibrating slit plate 31 are projected into the first row of photoelectric conversion elements $33_{11}$ through $33_{13}$ on the photoelectric convertor 33. Light reflected from the measurement points $P_{21}$ through $P_{23}$, $P_{31}$ through $P_{33}$ in FIG. 2 and passing through the corresponding slits in the vibrating slit plate 31 is projected into the respective photoelectric conversion elements $33_{21}$ through $33_{23}$, $33_{31}$ through $33_{33}$ in the second and third rows of the photoelectric converter 33. The detection signals from the photoelectric conversion elements $33_{11}$ through $33_{33}$ are supplied via amplifiers $46_{11}$ through $46_{33}$ to synchronous commutators $47_{11}$ through $47_{33}$. The synchronous commutators $47_{11}$ through $47_{33}$, by the synchronous commutation of the input detection signals using a drive signal DS for the vibrator 32, produces a focus signal which changes nearly proportionally to the focal point position of the corresponding measurement points within a specified range. Here, the focus signals output from the synchronous commutators $47_{11}$ through $47_{33}$ undergo calibration so as to become 0 when the corresponding measurement point matches the image formation plane (best focus plane) of the projection optical system 11.

The focus signals output from the synchronous commutators $47_{11}$ through $47_{33}$ are supplied in parallel to the multiplexer 48. The multiplexer 48, synchronously with a changeover signal from the microprocessor (MPU) 50 in the main control system 20, supplies focus signals selected in order from the focus signals supplied to the analog/digital (A/D) converter 49, and the digital focus signals output from the A/D converter 49 are stored sequentially in the memory 51 of the main control system 20.

Figure 7:
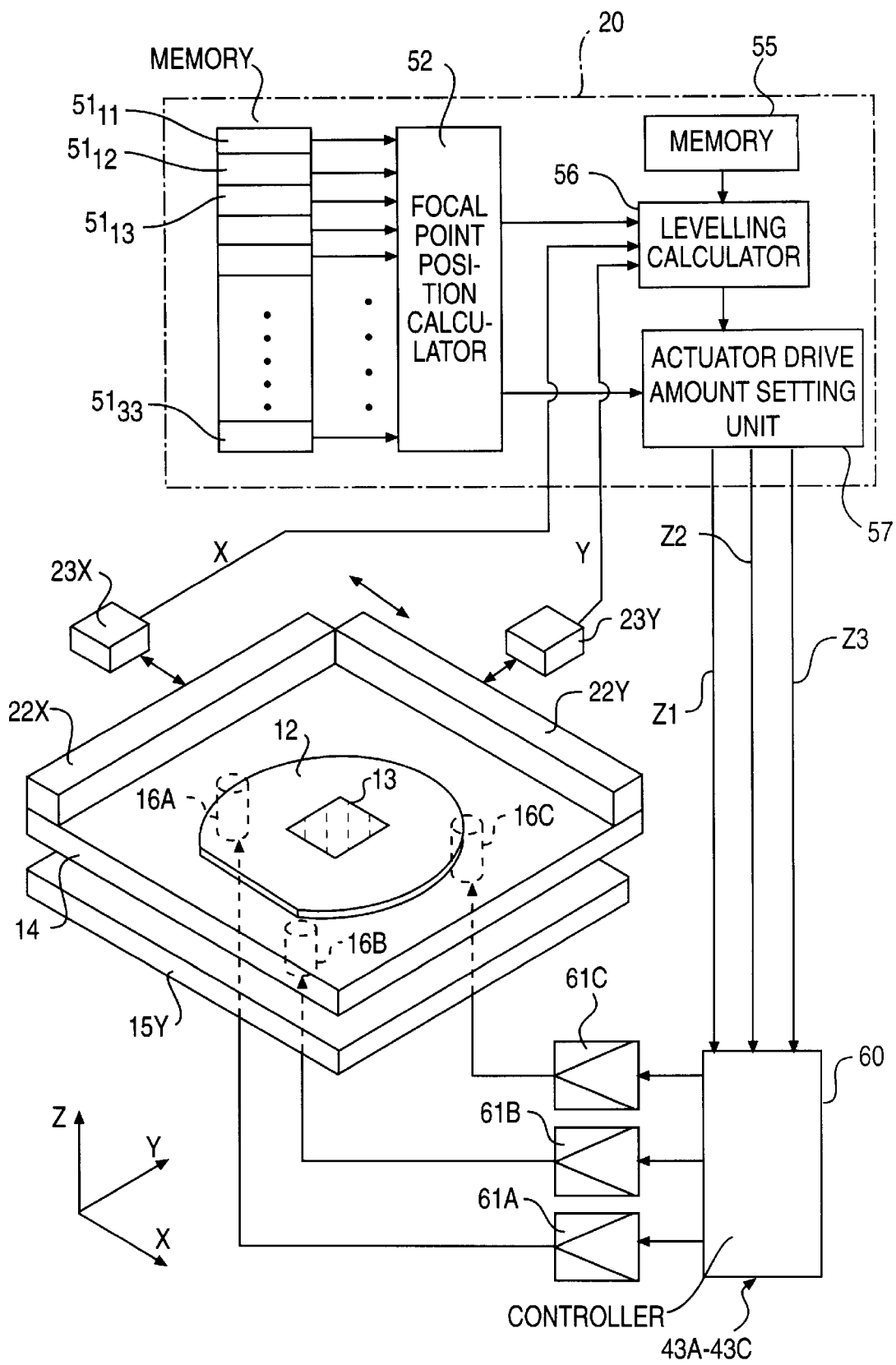
FIG. 7 is a diagram showing the drive system of the three actuators.

FIG. 7 shows the drive system of the three actuators 16A through 16C. Digital focus signals which indicate the focal point positions at measurement points $P_{11}$ through $P_{33}$ in FIG. 2 are stored, respectively, in addresses $51_{11}$ through $51_{33}$ in the memory 51 in the main control system 20. Focus signals read out from the addresses $51_{11}$ through $51_{33}$ are supplied in parallel to the focal point position calculator 52. In the focal point position calculator 52, based on the 9 focus signals corresponding to the nine measurement points $P_{11}$ through $P_{33}$, the focal point position z of the shot area 13, i.e., the amount of Z direction deviation from the best focus plane of the projection optical system 11, is obtained by calculations such as least square calculation, arithmetic mean, weighted average, etc.

For example, the calculation of the focal point position z by the least square method is performed as follows. If the deviations from the best focus obtained from the nine focus signals corresponding to nine measurement points $P_{11}$ through $P_{33}$ are called $\Delta Z_{11}, \Delta Z_{12}, \ldots, \Delta Z_{33}$, respectively, the focal point position z is determined so that the value of the following numerical expression 1 is minimal.
Numerical Expression 1

$$(z-\Delta Z_{11})^2 + (z-\Delta Z_{12})^2 + \ldots + (z-\Delta Z_{33})^2$$

The focal point position z obtained in this way is supplied to the levelling computer 56 when levelling control is performed and is supplied to the actuator drive amount setting unit 57 when each shot exposure is performed.

In the memory 55 of the main control system 20, the displacement of the measurement point in the Z direction due to running of the substrate stage is measured in advance and stored as an XY coordinate function $F_z(X,Y)$. The data $F_z(X,Y)$ can be obtained, for example, by mounting a standard substrate having a flat surface, the degree of parallel of the front and back surface of which is already known on the mounting object table 14 of the substrate stage, and measuring the focal point positions of the standard substrate in coordinates (X,Y) using the central measurement point $P_{22}$ of the multipoint AF system 25 while moving the substrate stage 2-dimensionally in the X and Y directions.

Next, levelling control and focus control methods when shot exposure is performed by means of this exposure apparatus will be explained.

Figure 8:
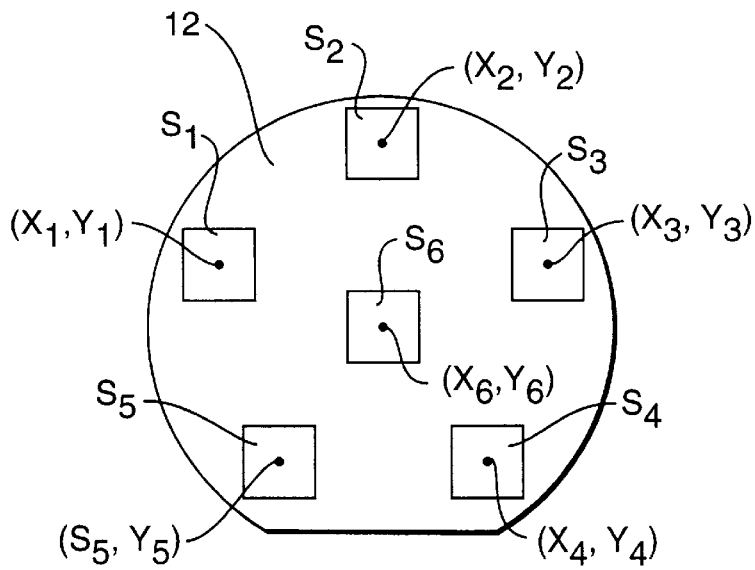
FIG. 8 is a diagram showing measurement points for levelling control.
Figure 9:
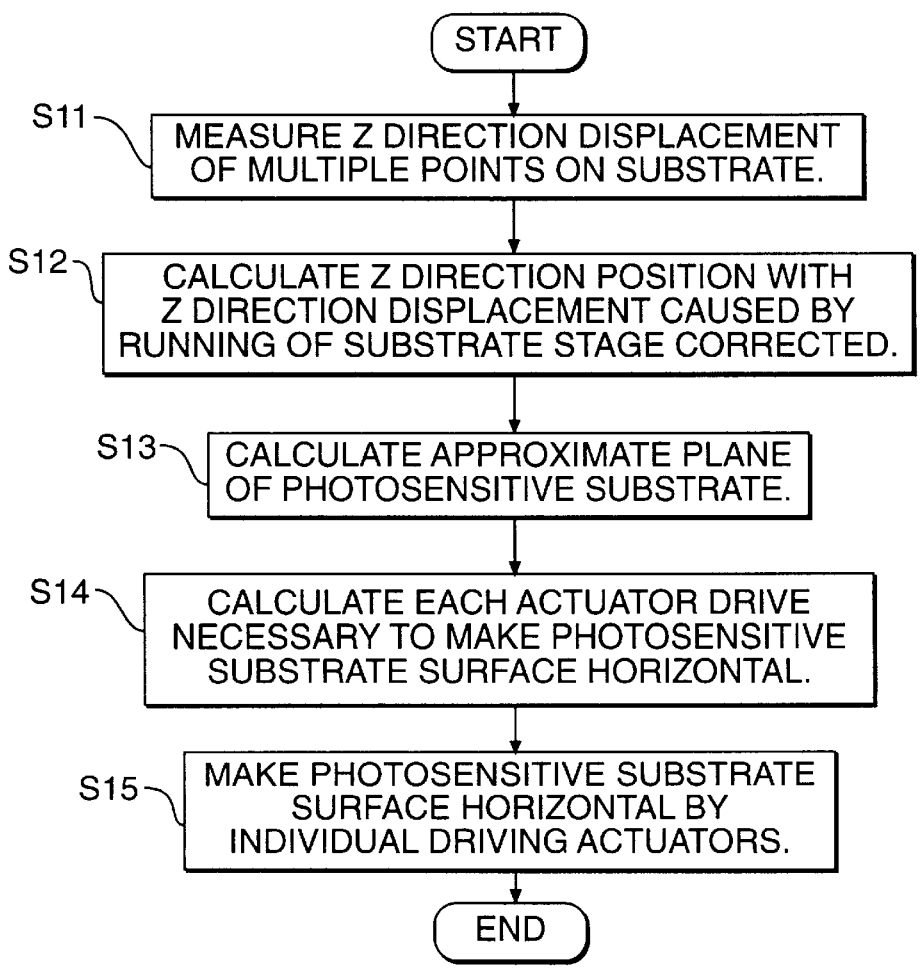
FIG. 9 is a levelling control flow chart.

First, using FIG. 8, which shows the measurement points used in levelling control on the photosensitive substrate, and FIG. 9, which is a flow chart, the levelling control of FIG. 6 will be explained. By driving the X stage 15X and Y stage 15Y, multiple areas which are previously determined on the photosensitive substrate 12, for example, 6 areas $S_1, S_2, \ldots, S_6$ shown in FIG. 8, are moved sequentially under the projection optical system 11, and by means of the multipoint AF system 25, the amount of deviation from the best focus position in representative positions of the areas $S_1, S_2, \ldots, S_6$, for example, center positions $(X_1, Y_1), (X_2, Y_2), \ldots, (X_6, Y_6)$ in each area, i.e., the focal point positions $z_1, z_2, \ldots, z_6$ are calculated in step (S11). These focal positions $z_1, z_2, \ldots, z_6$, may be obtained by calculating by means of the Numerical Expression 1 least square method with regard to the focus signals obtained from the nine measurement points set in each region $S_1, S_2, \ldots, S_6$ in the focal point position calculator 52 of the main control system 20.

The output of the focal point position calculator 52 is supplied to the levelling calculator 56. Simultaneously, the output of the laser interferometers 23X and 23Y is supplied to the levelling calculator 56, and the data of the coordinates $(X_1, Y_1), (X_2, Y_2), \ldots, (X_6, Y_6)$, of the representative points of each measurement area $S_1, S_2, \ldots, S_6$ on the photosensitive substrate 12 and the data of the focal point positions $z_1, z_2, \ldots, z_6$ of each measurement area are extracted. Next, using data stored in the memory 55, the Z position direction of the representative points in the measurement areas caused by the running of the substrate stage is corrected for each position as indicated by the following numerical expression 2, and deviation amounts $\delta Z_1, \delta Z_2, \ldots, \delta Z_6$ from the best focus position at each measurement point resulting only from the surface form of the photosensitive substrate are obtained in step (S12).

Numerical Expression 2

$$\delta Z_j = z_j - F_z(X_j, Y_j)(j=1,2,\ldots,6)$$

Using the data of the Z direction displacement amounts $\delta Z_1, \delta Z_2, \ldots, \delta Z_6$ in the multiple positions obtained $(X_1, Y_1), (X_2, Y_2), \ldots (X_6, Y_6)$, the levelling calculator 56 obtains the approximate plane of the photosensitive substrate 12 mounted on the mounting object table 14 by means of the least square method in step (S13). The data of the approximate plane of the photosensitive substrate 12 is supplied to the actuator drive amount setting unit 57.

Using the data of the approximate plane of the photosensitive substrate 12 and the XY coordinate data of the 3 actuators 16A, 16B, and 16C, the actuator drive amount setting unit 57 calculates the drive amounts $Z_1, Z_2, Z_3$ of the respective actuators 16A, 16B, 16C necessary to make the surface of the photosensitive substrate horizontal, i.e., parallel to the best focus plane of the projection optical system 11, step (S14).

The command values of the drive amounts $Z_1, Z_2, Z_3$ of the actuators 16A, 16B, 16C are supplied to the controller 60, and the controller 60 drives the actuators 16A, 16B, 16C via power amplifiers 61A, 61B, 61C. Also, detection signals from the rotary encoders 43A through 43C (having the same constitution as the rotary encoder 43 shown in FIG. 6) of the actuators 16A, 16B, 16C are supplied as feedback to the controller 60. By this means, the actuators 16A, 16B, 16C are driven accurately until reaching the respective height positions commanded from the actuator drive amount setting unit 57, step (S15). In this way levelling control is completed and the surface of the photosensitive substrate 12 is made parallel with the best focus plane of the projection optical system.

Figure 10:
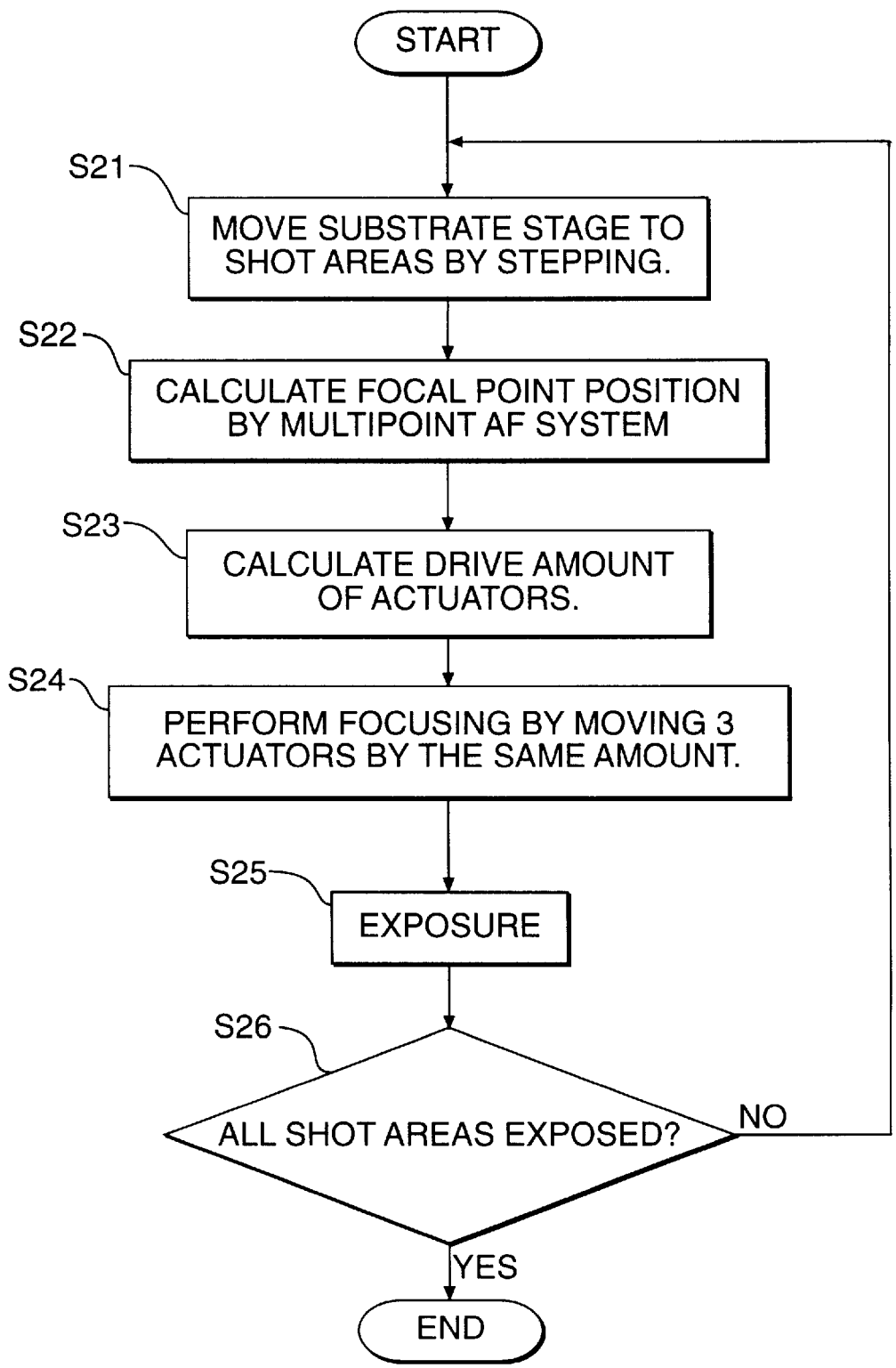
FIG. 10 is a flow chart for focusing control by means of actuators when shot exposure is performed on the photosensitive substrate.

Next, using the flow chart in FIG. 10, focusing control by means of the actuators when shot exposure is performed on the photosensitive substrate will be explained. When exposure operation is entered, levelling control as explained above is completed, and the surface of the photosensitive substrate 12 is made parallel with the best focus plane of the projection optical system 11.

First, the shot areas of the photosensitive substrate 12 are stepped in the exposure field of the projection optical system 11 by the drive control of the X stage 15X and Y stage 15Y via the substrate stage control system 24 in step (S21). Next, the focal point position z in that shot field is obtained by the multipoint AF system 25, step (S22). The focal point position z of the shot area is obtained by the calculation processing of the focus signals obtained from the nine measurement points $P_{11}$, through $P_{33}$ shown in FIG. 2 by the focal point position calculator 52 as explained above. The signal of the focal point position z calculated by the focal point position calculator 52 this time is not sent to the levelling calculator but rather to the actuator drive amount setting unit 57, and in the actuator drive amount setting unit 57 the drive amounts of the 3 actuators 16A, 16B, 16C are obtained, step (S23).

At the time of levelling control, the extension and retraction amounts of the 3 actuators were controlled individually in order to make the surface of the photosensitive substrate parallel to the best focus plane of the projection optical system. However, in focus control, since control is performed so that the photosensitive substrate, the surface of which already has been made parallel to the best focus plane, is raised and lowered, and the shot area is matched to the best focus plane, the extension and retraction drive amounts of the 3 actuators are set so as to be equal.

The command values of the drive amounts of the actuators 16A, 16B, 16C are supplied to the controller 60, and the controller 60 drives the actuators 16A, 16B, 16C by the specified drive amounts via the power amplifiers 61A, 61B, 61C. At this time the controller 60 controls the drive amounts of the actuator 16A, 16B, 16C precisely using the detection signal supplied as feedback from the rotary encoders 43A through 43C in the actuators 16A, 16B, 16C (S24). After the focus control is finished in this way, exposure of the mask pattern image on the shot area is performed, step (S25). When exposure has been completed on all of the shot areas on the photosensitive substrate 12, step (S26), the process returns to step 21, the step movement of the photosensitive substrate is performed, and the focus control and exposure operations are repeated.

Figure 11:
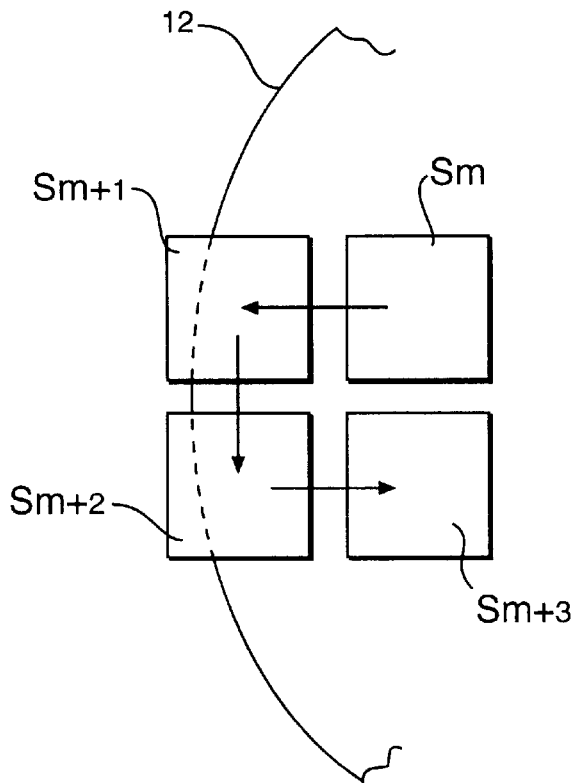
FIG. 11 is a diagram explaining focus control in shot areas on the periphery of the photosensitive substrate.

Next, using FIG. 11, the focus control operation with regard to the shot areas in the photosensitive substrate periphery will be explained. When the shot area is located in the periphery of the photosensitive substrate as shown in FIG. 11, there are cases where the detection region of the multipoint AF sensor 25 falls outside of the photosensitive substrate. In such cases, it is not possible to perform focus detection using the multipoint AF sensor 25 on this shot area, and in the past, exposure has been performed by applying the focal point position detected for an adjacent shot area to the shot area in question.

For example, when exposure is performed in the order of shots $S_m, S_{m+1}, S_{m+2}, \ldots$, shot area $S_m$ can be exposed by performing normal focus control, but since the following shot area $S_{m+1}$ and shot area $S_{m+2}$ are partially detached from the surface of the photosensitive substrate 12, focal point detection by means of the multipoint AF system 25 cannot be performed. In such cases, in the past pattern exposure has been performed by applying the focal point position $Z(S_m)$ of the immediately previous shot area $S_m$ to shot area $S_{m+1}$ and shot area $S_{m+2}$. If there is no Z direction displacement due to running of the substrate stage, focal point deviation will not occur in this method, but if Z direction displacement has occurred due to substrate stage running, if exposure is performed using the focal point position of the adjacent shot, focal point blurring will occur.

Figure 12:
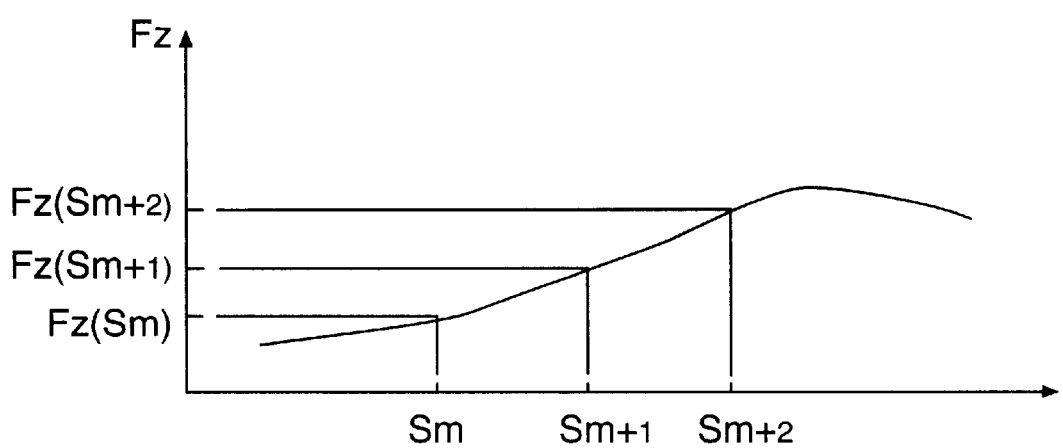
FIG. 12 is a diagram explaining the Z direction displacement caused by the running of the substrate stage when the substrate stage is moved to each shot area.
Figure 13:
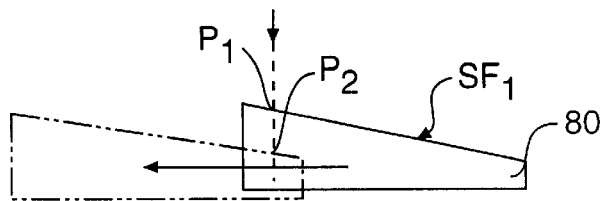
FIG. 13 is a diagram explaining problems in conventional levelling control; (a) through (c) are diagrams explaining the concept of levelling control when running of the substrate stage does not create displacement in the Z direction, and (d) through (f) are diagrams explaining the concept of levelling control when substrate stage running creates displacement in the Z direction.
Figure 13:
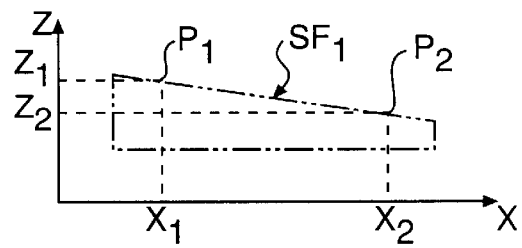
Figure 13:
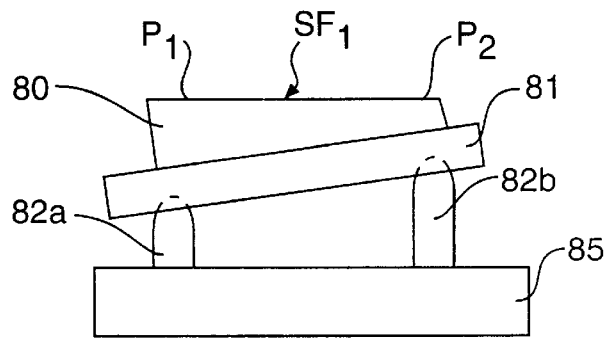
Figure 13:
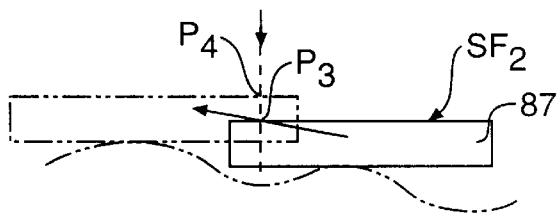
Figure 13:
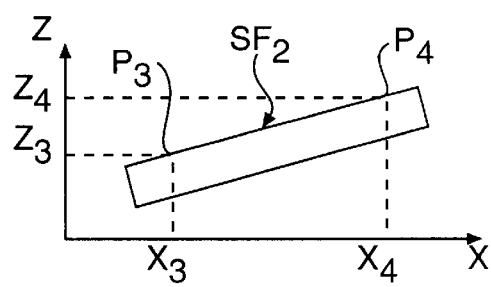
Figure 13:
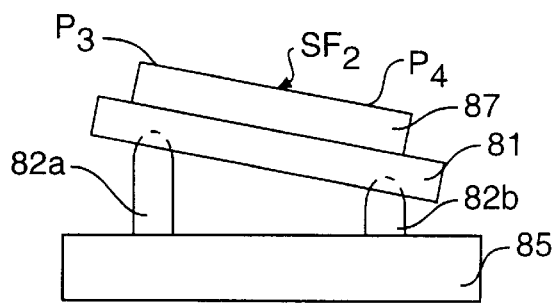

Here the occurrence of focal point blurring can be prevented by performing focal point position control using the Z direction displacement $F_z(X,Y)$ resulting from substrate stage running which has been previously measured and stored in the memory 55. Specifically, as shown in FIG. 12, the Z direction displacement $F_z(S_m)$ with regard to the center coordinates of the shot area $S_m$, the Z direction displacement $F_z(S_{m+1})$ with regard to the center coordinates of the shot area $S_{m+1}$, and Z direction displacement $F_z(S_{m+2})$ with regard to the center coordinates of the shot area $S_{m+2}$ are calculated from the $F_z(X,Y)$ stored in the memory 55. Then, after focus control and exposure has been performed on the shot area $S_m$, in shot area $S_{m+1}$, by driving the actuators 16A, 16B, 16C simultaneously to the extent of the Z direction displacement of the photosensitive substrate caused by substrate stage running as indicated in the following numerical expression 3 in the focal point position of shot area $S_m$, exposure is performed while compensating for the effects of substrate stage running.

Numerical Expression 3

$$F_z(S_{m+1}) - F_z(S_m)$$

In the exposure of the next shot area $S_{m+2}$, similarly, actuators 16A, 16B, 16C are driven simultaneously to the extent of the Z direction displacement of the photosensitive substrate caused by substrate stage running as indicated in the following numerical expression 4 on the focal point position of shot area $S_{m+1}$, and exposure is performed compensating for the effects of substrate stage running.

Numerical Expression 4

$$F_z(S_{m+2}) - F_z(S_{m+1})$$

In this way, by parallel movement of the photosensitive substrate 12 in a direction which eliminates the influence of Z direction displacement caused by running of the substrate stage and performing peripheral shot exposure, even when focal point position detection cannot be performed, the focal point position can be matched with a higher precision compared to conventional methods.

When the substrate stage has been worn by extended use, etc., Z direction deviation caused by running of the substrate stage can again be measured by means of a standard substrate the flatness of the front and back surfaces of which is already known, and the data stored in the memory 55 can be updated.

Figure 14:
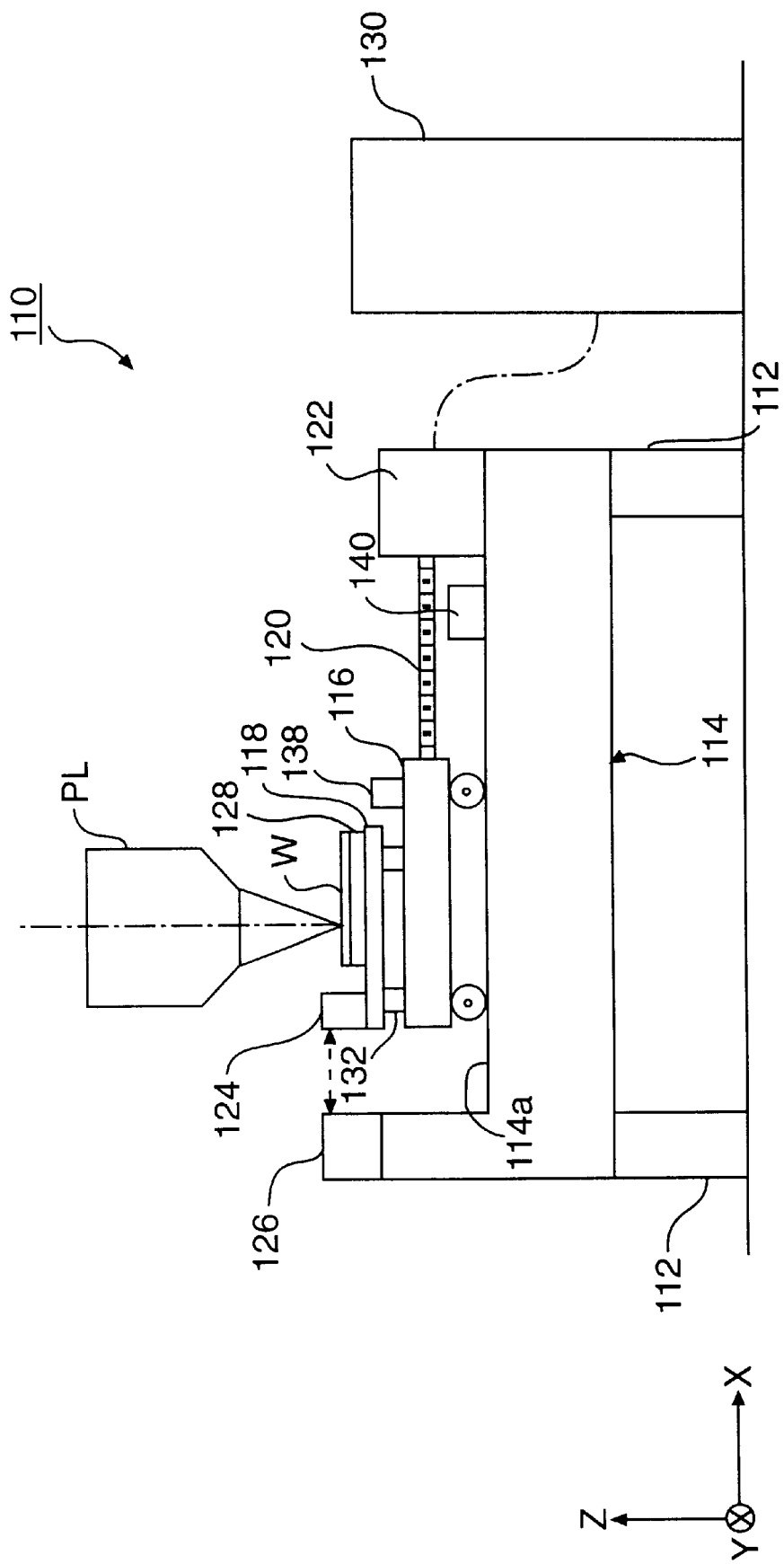
FIG. 14 a diagram showing a schematic configuration of a stage apparatus in accordance with a preferred embodiment.

FIG. 14 shows a stage apparatus which has an antivibration stand (114), which is held horizontally via at least 3 antivibration pads (112); a No. 1 stage (116), which is able to move in at least a specified No. 1 axial direction along the guidance plane (114*a*) on this antivibration stand (114); a No. 2 stage (118), which is mounted on the No. 1 stage and is able to rotate on 2 perpendicular axes in a plane parallel to the stage movement plane; a moving mirror (124), which is fixed to the No 2 stage; a lightwave interferometer (126), which by projecting a measuring beam (IL) in the No. 1 axial direction toward the moving mirror and receiving the reflected light thereof measures the position of the No. 2 stage (118) in the No. 1 axial direction; a No. 1 level (138), which is mounted on the No. 1 stage; a measurement device (136) (see FIG. 16), which measures the change portion of the relative angle between the No. 1 stage and the No. 2 stage; a computation device (130), which calculates the change in the relative angle between the measurement beam (IL) optical axis and the moving mirror (124) reflecting face using the output of the measurement device and the No. 1 level; and a computation control/correction device (130), which, while monitoring the measurement value of the lightwave interferometer, in positioning the No. 2 stage in a target position, corrects the measurement value of the lightwave interferometer using the relative angle difference between the measurement beam optical axis and the moving mirror reflecting face calculated in real time by the computation device.

By this means, when the No. 1 stage moves on the antivibration stand in the No. 1 axial direction along the guidance plane, the No. 2 stage mounted on the No. 1 stage moves in the No. 1 axial direction in unison with the No. 1 stage. At this time, the position of the No. 2 stage in the No. 1 axial direction is measured by the lightwave interferometer via the moving mirror.

In the movement of the No. 1 stage, the relative angle between the No. 1 stage and the measurement beam optical axis changes by the amount β due to the inclination, etc., within the guidance plane (here it is assumed that the antivibration stand provided with the guidance plane is not inclined with regard to absolute level), and at this time due to some cause the relative angle of the No. 1 stage and No. 2 stage changes by a specified angle amount θ. The change in the relative angle between the measurement beam optical axis and the moving mirror reflecting face at this time is made α. At this time, the relative angle change β between the No. 1 stage and the measurement beam optical axis is measured by the No. 1 level, and the output of the measurement device which measures the proportion of change in the relative angle of the No. 1 stage and No. 2 stage becomes θ. Accordingly, using the output of the measurement device and the No. 1 level, the computation device calculates the relative angle change between the measurement beam and the moving mirror reflection face (α=θ−β). Also, in this case, where there is no change in the relative angle of the No. 2 stage and the No. 1 stage, θ=0, so that the computation device calculates the relative angle change between the measurement beam and the moving mirror reflecting face (α=−β) using the output of the measurement device and No. 1 level.

In the positioning of the No. 2 stage in the target position, along with the movement of the No. 1 stage, the relative angle change α between the measurement beam optical axis and the moving mirror reflecting face is calculated in real time as described above by the computation device, and while the measurement value of the lightwave interferometer is monitored by the correction device, the measurement value of the lightwave interferometer is corrected using the relative angle change α between the measurement beam optical axis and the moving mirror reflecting face which has been calculated as described above in real time by the computation device. By this means, even if a change in the relative angle occurs between the measurement beam optical axis and the moving mirror reflecting face, the No. 2 stage can be accurately positioned in the target position without being influenced thereby.

In the movement of the No. 1 stage, the antivibration stand can be inclined by a specified angle γ with regard to absolute level due to the movement of the center of gravity accompanying the movement of the No. 1 and No. 2 stages. In such cases, the measurement result of the No. 1 level becomes the sum (β+γ) of the relative angle difference β of the No. 1 stage with regard to the measurement beam optical axis and the angle of inclination γ of the antivibration stage with regard to absolute level.

The γ is measured by the No. 2 level, and the relative angle change between the measurement beam and the moving mirror reflecting face (α=θ−(β+γ)+γ=θ−β) by the computation device based upon the output of the measurement device and the output of the No. 1 and No. 2 levels.

In positioning the No. 2 stage on the target position, in conjunction with the movement of the No. 1 stage, the relative angle change (α=θ−γ) between the measurement beam optical axis and the moving mirror reflecting face is calculated in real time as described above by the computation device, and while the measurement value of the lightwave interferometer is monitored by the correction device, the measurement value of the lightwave interferometer is corrected using the relative angle change α between the measurement beam and the moving mirror reflecting face measured in real time as described above by the computation device. By this means, even if a relative angle change between the measurement beam optical axis and the moving mirror reflecting face occurs and the antivibration stand becomes tilted, it is possible to position the No. 2 stage accurately in the target position without being affected thereby.

The invention includes a stage apparatus which has an antivibration stand (114), which is held horizontally via at least 3 antivibration pads (112); a No. 1 stage (116), which is able to move in at least a specified No. 1 axial direction along the guidance plane on this antivibration stand (114); a No. 2 stage (118), which is mounted on the No. 1 stage and is able to rotate on 2 perpendicular axes in a plane parallel to the stage movement plane; a moving mirror (124), which is fixed to the No. 2 stage; a lightwave interferometer (126), which by projecting a measuring beam (IL) in the No. 1 axial direction toward the moving mirror and receiving the reflected light thereof measures the position of the No. 2 stage in the No. 1 axial direction; a measurement device (136), which measures the change portion of the relative angle between the No. 1 stage and the No. 2 stage; a memory (170), in which data of the diagonal distribution of the No. 1 stage that has been previously measured with regard to the guidance plane (114a) is stored as a function of the stage coordinates; a computation device (130), which calculates the relative angle change between the measurement beam and the moving mirror reflecting face based upon the measurement value of the measurement device and the data of the diagonal distribution of the corresponding stage position in the memory; and a device (130), which, while monitoring the measurement value of the lightwave interferometer, when positioning the No. 2 stage in a desired position, corrects the measurement value of the lightwave interferometer based upon the relative angle difference between the measurement length beam optical axis and the moving mirror reflecting face calculated by the computation device.

By this means, when the No. 1 stage moves along the guidance plane over the antivibration stand in the No. 1 axial direction, the No. 2 stage, which is mounted on the No. 1 stage, moves in the No. 1 axial direction in unison with the No. 1 stage. At this time, the position of the No. 2 stage in the No. 1 axial direction is measured via the moving mirror by the lightwave interferometer. Meanwhile, data of the diagonal distribution in the guidance plane that has been previously measured is stored as a function of stage coordinates in the memory.

In the movement of the No. 1 stage as described above, if for some reason the relative angle of the No. 1 stage and the No. 2 stage has changed by a specified angle θ, this value θ is measured by a measurement device which measures the change in the relative angle between the No. 1 stage and No. 2 stage, and the relative angle change between the measurement beam and the moving mirror reflecting face is calculated by the computation device based upon the measurement value of this measurement device and the stage position corresponding thereto, i.e., the data of diagonal distribution in the memory corresponding to the stage position determined in accordance with the interferometer output at the time the measurement device performed measurement.

In the positioning of the No. 2 stage on the target position, the relative angle change between the measurement beam optical axis and the moving mirror reflecting face is calculated as described above by means of a computation device in conjunction with the movement of the No. 1 stage, and the correction device corrects the measurement value of the light wave interferometer based on the relative angle change between the measurement beam optical axis and the moving mirror reflecting face calculated as described above by the computation device while monitoring the measurement value of the lightwave interferometer. By this means, even if relative angle change between the measurement beam and moving mirror reflecting face occurs, the No. 2 stage can be positioned accurately on the target position without being affected thereby.

In this case, the data of the diagonal distribution of the No. 1 stage with regard to the guidance plane in the memory can be data of the inclination of the No. 1 stage with regard to the guidance plane corresponding to the position of the No. 1 stage obtained by moving the No. 1 stage in advance within its movement range, and the measurement method is not subject to any special limitations, but, for example, the data of the diagonal distribution of the No. 1 stage with regard to the guidance plane in the memory (170) may be function data of stage coordinates obtained by moving the No. 1 stage (116) in its movement range while monitoring the output of the No. 1 level (138) mounted on the No. 1 stage (116) and the No. 2 level (140) mounted on the antivibration stage (114).

Preferred embodiments of the present stage apparatus invention are explained below based on FIG. 14 through FIG. 17.

In FIG. 14, the configuration of a stage apparatus (110) in accordance with a preferred embodiment is shown schematically. This stage apparatus (110) constitutes the wafer stage part of a step-and-repeat type reductive projection type exposure apparatus (so-called stepper).

This stage device 110 is provided with a fixed base 114 as an antivibration stand which is maintained level by at least 3 (here 4) antivibration pads 112 (the 2 antivibration pads behind the sheet face are omitted from the figure), an XY stage 116, as the No. 1 stage which is movable in 2 dimensions, the X axis direction (left-right direction on the paper plane in FIG. 14) and the Y axis direction (direction perpendicular to the paper plane in FIG. 14) along the guidance plane 114a on this fixed base 114, a sample stand 118 as a No. 2 stage which is mounted on this XY stage 116, can be moved in the Z direction perpendicular to the XY plane and can be turned around the two perpendicular XY axes, a motor 122, which is fixed on the upper face of the fixed base 114 and drives the XY stage 116 via a feeding screw 120, a moving mirror 124, which is fixed on the sample stand 118, a laser interferometer 126 as a lightwave interferometer, which is fixed to one end (the upper extension on the left end in FIG. 14) of the fixed base 114, projects a measurement beam (interferometer laser beam) in the direction of the moving mirror (124), receives the reflected light therefrom, and measures the position in the XY two-dimensional directions of the sample stand 118, and a control apparatus 130, which controls the position of the XY stage 116 via a motor 122 based upon the measurement value of this laser interferometer 126.

As the antivibration pad 112, here a mechanical damper containing a compressed coil spring in a damping fluid or an air type damper, etc., is used, and the antivibration pad 112 itself is provided with a centering function to a certain degree.

The XY stage 116 is composed of a Y stage which is able to move in the Y axial direction along the guidance plane 114a on the upper face of the fixed base 114 and an X stage which moves in the X axial direction on this Y stage, and accordingly a motor and feed screw are provided for the X stage and Y stage, but in FIG. 14 these are shown representatively as the XY stage 16, feeding screw 120, and motor 122. Also, in actuality the Y moving mirror having a reflective face perpendicular to the Y axial direction and X moving mirror having a reflecting face perpendicular to the X axial direction are fixed on the sample stage 118, and an X laser interferometer and Y laser interferometer, which respectively measure the Y axial direction position and X axial direction position of the sample stand 118 by projecting a measurement beam correspondingly on the Y moving mirror and X moving mirror and receiving the respective reflected light, are provided, but in FIG. 14 these are shown representatively as the moving mirror 124 and laser interferometer 126.

Nevertheless, in the explanation of the present invention, since it is sufficient that the XY stage 116 as the No. 1 stage be able to move in a specified No. 1 axial direction, hereinafter for convenience of explanation, to the extent it is not especially necessary, the explanation is given assuming that the XY stage 116 is the one which moves in the X axial direction along the guidance plane 114a on the fixed base 114 and the position of the XY stage 116 in the X direction is measured by means of the laser interferometer 126 via the moving mirror 124.

A wafer W is held by suction as a sample via a wafer holder 128 on the sample stand 118. This sample stand 118 is supported at three points on its lower face by means of three support shafts 132 (in FIG. 14, the support shaft on the side behind the sheet is not shown), and each shaft is driven independently in the Z direction by means of a drive system not shown in the figure. Specifically, a Z tilt drive mechanism 134 (not shown in FIG. 14, see FIG. 16) is formed so that the sample stand 18 is driven in the Z direction and around the X and Y axes by means of the three support shafts 132 and this drive system. Also, the drive amount of each support shaft 132 is measured by means of a sensor such as a linear encoder or an electrostatic capacitance gauge, etc. (not shown in the figure), and a computation unit (not shown in the figure), which computes the amount of change in the relative angle of the XY stage (116) and sample stage (118) based upon the output of these sensors, is provided. Specifically, the measurement device 136 (not shown in FIG. 14, see FIG. 16) is composed of the sensor such as a linear encoder, etc., and computation unit.

In addition, in the stage apparatus (110) of this preferred embodiment, the No. 1 level 138 is attached to the upper face of the XY stage 116, and the No. 2 level 140 is attached on the guidance plane 114a on the upper face of the fixed base 114. Among these, the No. 1 level 138 is a sensor which measures the inclination of the XY stage 116 with regard to a standard level, here, absolute level (the plane perpendicular to an axis in a direction of the earth's center of gravity), and the No. 2 level 140 is a sensor which measures the inclination of the XY stage 116 with regard to the absolute level plane of the fixed base 114 on which the guidance plane is formed. So-called electronic levels are used as these No. 1 and No. 2 levels 138, 140.

Figure 15:
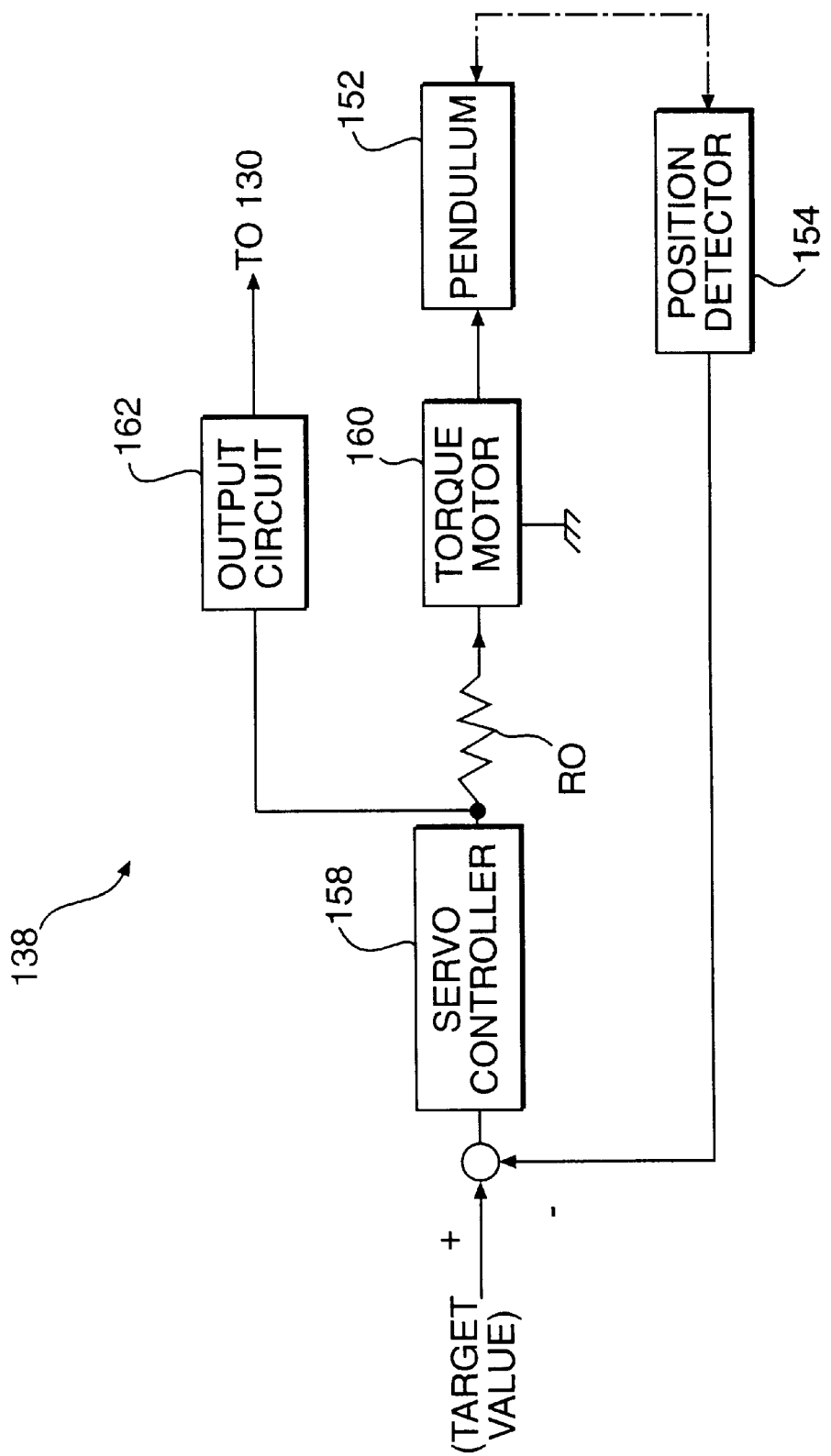
FIG. 15 is a block diagram showing an example of the configuration of the No. 1 level in FIG. 14.

FIG. 15 shows schematically a specific example of the configuration of the No. 1 level 138. This level 138 is provided with a pendulum 152, which is attached so as to be able to turn freely on a shaft fixed to a case, not shown in the figure, attached to the XY stage 116 as a measurement object, a position detector 154, which includes a photosensor not shown in the figure which detects the position of this pendulum 152, a subtracter 156, which computes the difference between the output of this position detector 154 and the target position (for example, a neutral position), a servo controller 158, which contains a servo amplifier, not shown in the figure, and which performs a control operation using the positional deviation which is the output of this subtracter 156 as an operating signal, and a torque motor 160, which drives the rotation of the pendulum 152 by generating force in accordance with the control amount provided by this servo controller 158.

Specifically, by means of this level 138, if the position in which the direction of the end of the pendulum 152 matches the direction of the earth's center of gravity is determined as the neutral position (target value) of the pendulum 152, and the pendulum 152 is displaced from the neutral position by the turning of the case (not shown in the figure), this is detected by the position detector 154, and the detection signal thereof is fed back to the subtracter 156. In the subtracter 156, the deviation of this position of the pendulum 152 and the target value (neutral position) is calculated and provided to the servo controller 158 as an operating signal, and the servo controller 158 performs closed loop control by applying control voltage to the torque motor 160 such that the pendulum 152 is returned to the target position (so that the deviation becomes 0). At this time, if the controlling electric current flowing into the torque motor 160 is converted to voltage via a fixed resistor R0 and extracted via an output circuit 162, a voltage signal proportional to the component of force of gravity acting upon the pendulum 152 will be obtained, and this signal will be proportional to the sine (sin φ) of the angle of inclination (here φ). Here, an arc-sine converter in addition to the output amp (neither shown in the figure) is incorporated in the output circuit 162, which is constituted so that a signal directly proportional to the angle of inclination φ (φ matches (β+γ) described below) is provided to the control apparatus 130.

The No. 2 level 140 is also constituted similarly to the No. 1 level 138, and provides a signal directly proportional to the angle of inclination (here γ) of the fixed base 14 with regard to the absolute level plane to the control apparatus 130.

In addition, in this preferred embodiment, a focus sensor 142 (not shown in FIG. 14, see FIG. 16), which detects the displacement amount (defocus amount) of the Z direction position of the wafer W surface (the focal position of the projection optical system PL shown in FIG. 1) and a levelling sensor 144 (not shown in FIG. 14, see FIG. 16), which detects the amount of inclination of the wafer surface W, etc., are provided.

Figure 16:
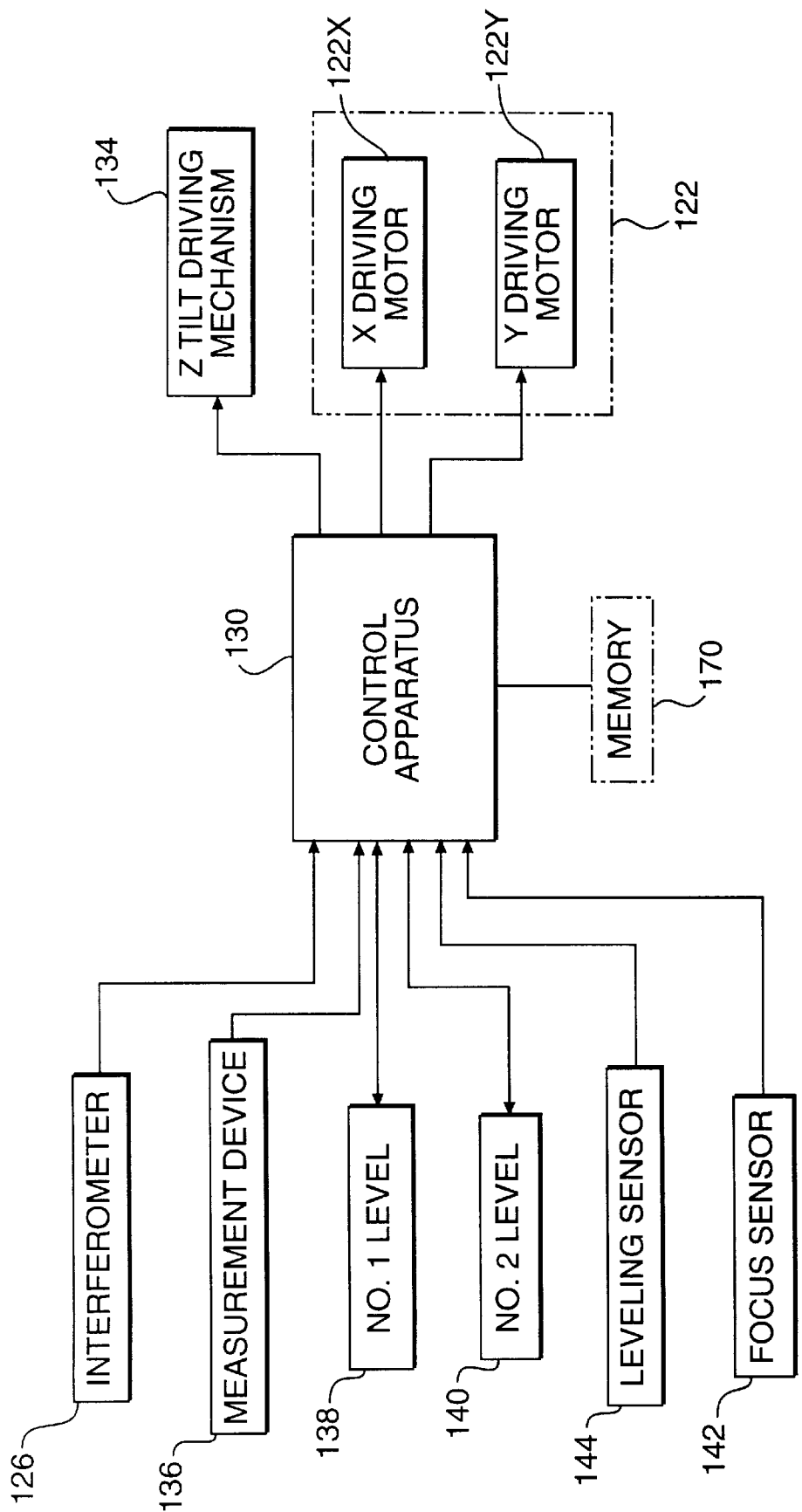
FIG. 16 is a block diagram showing schematically the essential configuration of a control system in a projection optic apparatus containing the stage apparatus shown in FIG. 14.

FIG. 16 schematically shows the essential configuration of the control system of the projection exposure apparatus including the stage apparatus (110). This control system is configured with the control apparatus 130, consisting of a microcomputer (or minicomputer) including a CPU, ROM, RAM, I/O interface (none shown in the figure), etc., at its center, and the laser interferometer 126, measurement device 136, No. 1 level 138, No. 2 level 140, levelling sensor 144, focus sensor 142, etc., are connected to the input part of this control apparatus 130. Also, the Z tilt drive mechanism 134, X driving motor 122X, and Y driving motor 122Y (in FIG. 14 represented as motor 122), etc., are connected to the output part of the control apparatus 130.

Next, the operation of the stage apparatus 110 in accordance with this preferred embodiment constituted as described above will be explained referring to FIGS. 17(A) and (B).

As shown in these figures, a case is explained by way of example in which the flatness of the wafer W surface is extremely poor, an inclined protrusion having an angle α is formed on a portion of the surface thereof, the guidance part 114a of the XY stage 116 is irregular, and an inclined plane is formed. Needless to say, although the irregularity of the wafer W surface and the irregularity of the guidance part is extremely minute, in order to facilitate the explanation here a diagram in which an extreme inclined part and inclined plane are formed is used.

Figure 17A:
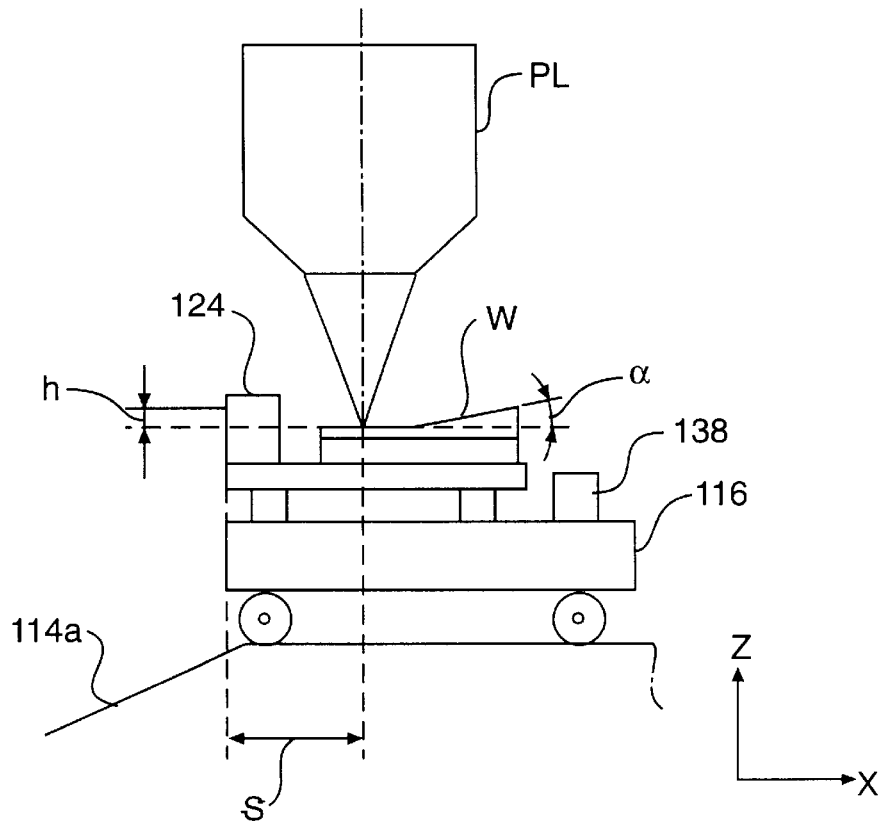
FIGS. 17A and 17B are diagrams explaining the operation of the apparatus shown in FIG. 14.

First, as shown in FIG. 17(A), in the exposure of the shot region on the wafer W, when a portion of the wafer W surface parallel to the horizontal plane is in the exposure position, the measurement beam (hereinafter referred to as "interferometer laser") IL is projected perpendicular to the moving mirror reflecting face, and it is assumed that the angle of inclination of the XY stage 116 with regard to the absolute level plane (standard plane) is nearly 0. When exposure is completed in this position, the movement of the XY stage 116 toward the left side of the sheet in FIG. 17(A) is begun, and when it moves to the position indicated in FIG. 17(B), since this position corresponds to the inclined protrusion at angle α on the wafer W surface, the control device 130, based on the output of the focus sensor 142 and levelling sensor 144 performs a focus and levelling adjustment, by controlling the Z tilt driving mechanism 134 so that the entire surface of the shot area of the wafer W surface is within the range of the focal depth of the projection optical system PL. The condition in which this focus and levelling adjustment has been performed is shown in FIG. 17(B).

Figure 17B:
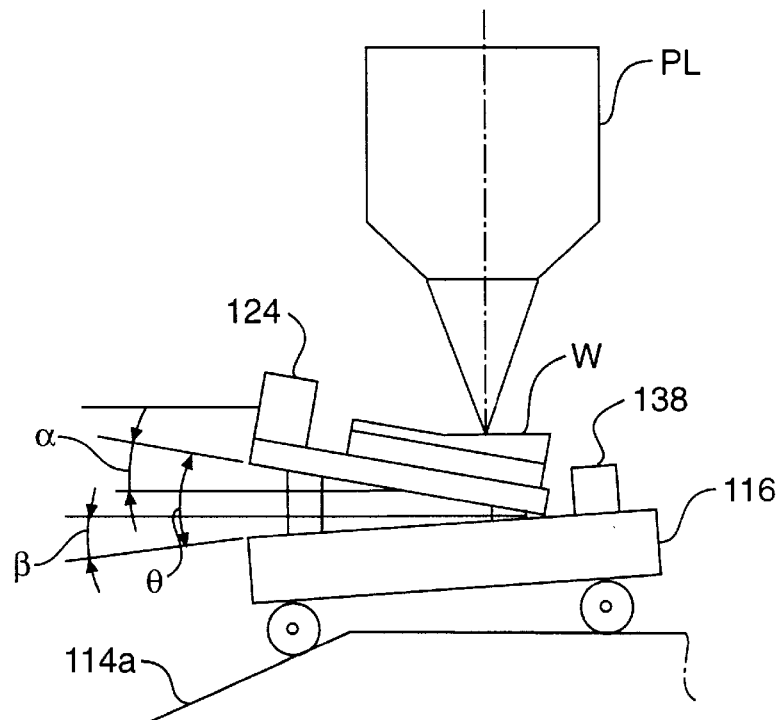

Here, in FIG. 17(A), the difference in the height in the optical axis Z direction of the interferometer laser IL and the shot area of the wafer W surface is called "h," and when the distance from the reflecting face of the moving mirror 124 to the exposure position is called "S," in FIG. 17(B), when the change in the inclination of the sample stand 118 around the Y axis with regard to the optical axis of the interferometer laser IL is made α, as described above, the X direction error Err represented by formula (1) is produced.

$$Err = Abbe\ error + cosine\ error = h \times \alpha + S \times (1 - \cos \alpha) \quad (1)$$

Also, in FIG. 17(B), due to the inclination of the guidance plane 14a, the XY stage 116 is inclined by the amount β with regard to the optical axis of the interference laser IL.

At this time, the relative angle change θ between the XY stage 116 and sample stage 118 is measured by the measurement device 136, and the angle of inclination γ of the fixed base 114 itself with regard to the standard plane is measured by the No. 2 level 140, in addition the angle of inclination (β+γ) of the XY stage 116 with regard to the standard plane is measured by the No. 1 level 138, and the measurement value of the measurement device 136, No. 1 level 138, and No. 2 level 140 are supplied to the control apparatus 130. The measurement value of the laser interferometer 126 is also supplied to the control apparatus 130.

The CPU in the control device 130 calculates the change in the angle of inclination of the XY stage 116 with regard to the optical axis of the interferometer laser IL based on the output of the No. 1 and No. 2 levels 138, 140 {β=(β+γ)−γ}, and based on this value and θ, which is the output of the measurement device 36, calculates the relative angle change (α=θ−β) between the interferometer laser IL optical axis and the reflecting face of the moving mirror 124.

Then, the CPU in the control apparatus 130 calculates the X direction error Err based upon formula (1) using the relative angle change a calculated in this way and the distance S obtained from the measurement values of the interferometer 126, and by correcting the measurement value of the interferometer 126 by this error amount, positions the XY stage 116, and hence the sample stage 118 accurately in the target position.

Specifically, when the control apparatus 130 positions the sample stand 118 in the target position by controlling the motor 122 while monitoring the measurement values of the laser interferometer 126, it corrects the measurement value of the laser interferometer 126 using the relative angle change α between the optical axis of the laser interferometer IL calculated in real time as described above and the reflecting face of the moving mirror 124.

In the explanation up to this point, only the case in which the X coordinate of the sample stage 118 is corrected has been explained, but needless to say the Y coordinate can be corrected in the same way.

Also, as is clear from the explanation up to this point, a computation device and correction device are realized by the function of the control apparatus 130 in this preferred embodiment, but, of course, these may be separate devices.

As explained above, by means of the stage apparatus 110 in accordance with the present preferred embodiment, the rotation β of the XY stage 116 around the Y axis (or X axis) caused by the flatness error of the guidance plane 114a is measured from the difference in the output of the No. 1 and No. 2 levels 138, 140, which are composed of electronic levels placed respectively on the XY stage 116 and guidance part 114a, and by subtracting the value β from the relative angle change θ between the XY stage 116 and the sample stand 118 measured by means of a measurement device 136 mounted on the XY stage 116, the relative angle change α between the optical axis of the interferometer laser IL and the reflecting face of the moving mirror 124 can be obtained. By this means, the correction of the XY coordinate measurement error of the sample stand 118 produced can be performed with a high level of accuracy by correcting the inclination of the sample stand 118 and matching the inclination of the wafer W and focal plane, and as a result the sample stand 118, and hence the wafer W thereon, can be positioned in the target position with high accuracy.

Also, in the explanation of the foregoing preferred embodiment, the explanation referred to a case in which the relative angle change α between the optical axis of the interferometer laser IL and the reflecting face of the moving mirror 124 is obtained taking into consideration the inclination γ of the fixed base 114 caused by fluctuations in the center of gravity of the apparatus accompanying the movement of the XY stage 116, but as stated previously, since devices having a certain degree of centering function are used as the antivibration pads 112, and in particular when an air type damper is used is an antivibration pad, the inclination γ of the fixed base 114 can be made so small that it can be ignored, so that in this case the No. 2 level 140 is unnecessary. In this case, it can be considered that this is a device in which the rotation of the XY stage (116) around the Y (or X axis) caused by the flatness error in the guidance plane 114a, i.e., the relative angle change β between the optical axis of the interferometer laser IL and the XY stage 116, can be measured directly by means of the No. 1 level 138.

In the preferred embodiment, in the positioning of the sample stand 118 in the target position, a case was cited in which the rotational angle β of the XY stage 116 around the Y (or X axis) caused by defects in the flatness of the guidance plane 114a as described above is detected in real time, but the present invention is not limited to this.

For example, in the same way as in the preferred embodiment, it is possible to mount the No. 1 level 138 on the XY stage 116, mount the No. 2 level 140 on the fixed base 114, to move the XY stage 116 within its movement range while monitoring the output of the levels 138 and 140, measure the diagonal distribution of the XY stage 116 with regard to the guidance plane 114a by a method similar to that of the preferred embodiment, and to store the data of this diagonal distribution in a memory 170 indicated by the imaginary line in FIG. 16 as function data of the stage coordinates. In this case, in using the device, since the No. 1 and No. 2 levels 138, 140 are unnecessary, along with reducing the number of parts and reducing cost, since the angle β can be easily calculated based upon the data in the memory 170 corresponding to the measurement values of the measurement device 136 and the measurement coordinates of the laser interferometer 126, the calculation processing time for positioning is shortened.

However, in this case, since there is a concern that an error will occur with the passage of time, a device which performs measurement in real time as in the preferred embodiment is preferable.

Moreover, in the preferred embodiment, the case of a configuration in which the XY stage 116 moves along an approximately horizontal guidance plane was cited, but the present invention is not limited to this, and the present invention may be applied in the same way to devices constituted so that the XY stage 116 moves along a vertical guidance plane provided on the fixed base 114.

Also, in the preferred embodiment, the case was explained in which the stage apparatus in accordance with the present invention was used in a projection exposure apparatus, but the range of application of the present invention is not limited to this, and the present invention can also be used in devices in which the No. 2 stage (sample stand) can be inclined, and the No. 2 stage is positioned based upon the output of a lightwave interferometer such as a laser interferometer.

It will be apparent to those skilled in the art that various modifications and variations can be made in an exposure apparatus of the present invention without departing from the spirit or scope of the invention. Thus, it is intended that the present invention cover the modifications and variations of this invention provided they come within the scope of the appended claims and their equivalents.

What is claimed is:

1. A stage apparatus comprising:
   a mounting object table, which holds a substrate;
   a positioning stage, which positions the mounting object table along a 2-dimensional movement coordinate system;
   a stage coordinate measurement device, which detects the position of the mounting object table in the 2-dimensional movement coordinate system;
   a height measurement device, which detects the deviation in a perpendicular direction to the 2-dimensional movement coordinate system from the surface of the substrate to a specified standard surface at a measurement point fixed with regard to the 2-dimensional movement coordinate system;
   a levelling device, which adjusts the inclination of the mounting object table with regard to the positioning stage;
   a computation device, which calculates the amount of levelling necessary to match the surface of the substrate with the standard surface;
   a control device, which controls the levelling device based on the calculation results of the computation device; and
   a memory device, which stores the perpendicular direction displacement amount of the mounting object table produced at a measurement point when the positioning stage is moved along the 2-dimensional movement coordinate system corresponding to the position of the mounting object table detected by the stage coordinate measurement device;
   wherein, the computation device calculates the amount of the levelling necessary based on a value obtained by subtracting the perpendicular direction displacement amount of the mounting object table stored in the memory device from the deviation detected by the height measurement device.

2. A stage apparatus in accordance with claim 1, further comprising a device which calculates a focal point position with regard to an adjacent shot and the displacement amount of the mounting object table in the perpendicular direction stored in the memory device.

3. A stage apparatus comprising:
   an antivibration stand, which is held horizontally via at least 3 antivibration pads;
   a No. 1 stage, which is able to move in at least a specified No. 1 axial direction along a guidance plane on the antivibration stand;
   a No. 2 stage, which is mounted on the No. 1 stage and is able to rotate on two perpendicular axes in a plane parallel to a stage movement plane;
   a moving mirror, which is fixed to the No. 2 stage;
   a lightwave interferometer, which by projecting a measuring beam in the No. 1 axial direction toward the moving mirror and receiving reflected light therefrom measures the position of the No. 2 stage in the No. 1 axial direction;
   a No. 1 level, which is mounted on the No. 1 stage;
   a measurement device, which measures a change in relative angle between the No. 1 stage and the No. 2 stage;
   a computation device, which calculates the change in relative angle between the measurement beam optical axis and a reflecting face of the moving mirror using an output of the measurement device and the No. 1 level; and a correction device, which, while monitoring the value measured by the lightwave interferometer, in positioning the No. 2 stage in a target position, corrects the value measured by the lightwave interferometer using the relative angle difference between the measurement beam optical axis and the reflecting face of the moving mirror calculated in real time by the computation device.

4. A stage apparatus in accordance with claim 3, further comprising a No. 2 level, which is mounted on the antivibration stand; and wherein the computation device calculates the relative angle change between the measurement beam optical axis and the reflecting face of the moving mirror based upon an output of the measurement device and outputs of the No. 1 and No. 2 levels.

5. A stage apparatus comprising:

an antivibration stand, which is held horizontally via at least 3 antivibration pads;

a No. 1 stage, which is able to move in at least a specified No. 1 axial direction along a guidance plane on the antivibration stand;

a No. 2 stage, which is mounted on the No. 1 stage and is able to rotate on two perpendicular axes in a plane parallel to a stage movement plane;

a moving mirror, which is fixed to the No. 2 stage;

a lightwave interferometer which by projecting a measuring beam in the No. 1 axial direction toward the moving mirror and receiving reflected light therefrom measures the position of the No. 2 stage in the No. 1 axial direction;

a measurement device, which measures a change in relative angle between the No. 1 stage and the No. 2 stage;

a memory, in which data of a diagonal distribution of the No. 1 stage, that has been previously measured with regard to the guidance plane, is stored as a function of stage coordinates;

a computation device, which calculates relative angle change between the measurement beam optical axis and a reflecting face of the moving mirror based upon a measurement value of the measurement device and the data of a corresponding stage position stored in the memory; and a correction device, which, while monitoring the value measured by the lightwave interferometer, when positioning the No. 2 stage in a target position, corrects the value measured by the lightwave interferometer based upon the relative angle difference between the measurement beam optical axis and the reflecting face of the moving mirror calculated by the computation device.

6. A stage apparatus specified in claim 5, wherein the data stored in the memory is function data of stage coordinates which is obtained by moving the No. 1 stage within a movement range thereof while monitoring the output of a No. 1 level which is mounted on the No. 1 stage and a No. 2 level which is mounted on the antivibration stand.

7. An exposure apparatus that forms a pattern of a mask on a substrate through a projection optical system, comprising:

a stage disposed at an image surface side of the projection optical system to be moveable in a predetermined plane, wherein the stage holds the substrate;

a stage position measurement device communicated with the stage to detect the stage position in the predetermined plane;

a height detector disposed on an apparatus body to detect a height information of the surface of the substrate held on the stage at a predetermined measurement point;

a memory connected to the stage position measurement device to store displacement data of the stage in a direction perpendicular to the predetermined plane of the stage produced at the predetermined measurement point when the stage is moved in the predetermined plane corresponding to the stage position detected by the stage position measurement device; and a computation device connected to the height detector and the memory to calculate drive data of the stage based on the displacement data of the stage stored by the memory and the height information detected by the height detector.

8. An apparatus according to claim 7, wherein the computation device corrects the detected height information based on the displacement data of the stage.

9. An apparatus according to claim 8, wherein the computation device calculates a difference between the image surface of the projection optical system and the surface of the substrate based on the corrected height information.

10. An apparatus according to claim 9, further comprising a setting device connected to the computation device to set the drive data of the stage based on the calculated difference between the image surface and the surface of the substrate amount.

11. An apparatus according to claim 10, further comprising a driver connected to the setting device and the stage to drive the stage based on the drive data of the stage.

12. An apparatus according to claim 7, wherein the height detector detects a plurality of height information pieces of the surface of the substrate, and wherein the computation device corrects the detected plurality of height information pieces based on the displacement data of the stage and calculates an approximate surface of the substrate based on the corrected plurality of height information pieces.

13. An apparatus according to claim 12, further comprising a leveling device connected to the computation device to adjust an inclination of the surface of the substrate with respect to the image surface of the projection optical system based on the approximate surface of the substrate calculated by the computation device.

14. An apparatus according to claim 13, wherein the leveling device adjusts the stage so that the surface of the substrate is in parallel with the image surface of the projection optical system.

15. An apparatus according to claim 10, wherein the stage has a table which holds the substrate, and the drive data of the stage set by the setting device is an inclination amount of the table relative to the stage.

16. An apparatus according to claim 13, wherein the stage has a table which holds the substrate, and the leveling device adjusts an inclination of the table relative to the stage.

17. A stage apparatus comprising:

a stage disposed on a base to be moveable in a predetermined plane;

an object table mounted on the stage to hold an object;

an object table position measurement device communicated with the object table to detect the object table position in the predetermined plane;

a height detector disposed on an apparatus body to detect height information of the surface of the object held on the object table at a predetermined measurement point;

a memory connected to the object table position measurement device to measure displacement data of the object table in a direction perpendicular to the predetermined plane of the object table produced at the predetermined measurement point when the stage is moved in the predetermined plane corresponding to the object table position detected by the stage position measurement device; and a computation device connected to the height detector and the memory, to calculate drive data of the object table with respect to the stage based on the displacement data stored by the memory and the height information detected by the height detector.

18. An apparatus according to claim 17, further comprising a plurality of actuators disposed between the stage and the object table.

19. An apparatus according to claim 18, further comprising a controller connected to the plurality of actuators to adjust an inclination of the object table relative to the stage.

20. An exposure method that forms a pattern of a mask on a substrate through a projection optical system, comprising the steps of:

moving a stage in a predetermined plane, the stage holding a substrate placed thereon;

detecting height information of the surface of the substrate held on the stage at a predetermined measurement point;

storing displacement data of the stage in a direction perpendicular to the predetermined plane of the stage produced at the predetermined measurement point when the stage is moved in the predetermined plane corresponding to a stage position in the predetermined plane; and calculating drive data of the stage based on the stored displacement data and the detected height information;

driving the stage based on the calculated drive data; and forming the pattern of the mask on the substrate.

21. An exposure method according to claim 20, wherein the drive data corresponds to a difference between an image surface of the projection optical system and the surface of the substrate.

22. An exposure method according to claim 20, wherein the step of detecting detects a plurality of height information pieces of the surface of the substrate, wherein the step of calculating corrects the plurality of height information pieces based on the displacement data of the stage and calculates an approximate surface of the substrate based on the corrected plurality of height information pieces, and wherein the step of driving drives the stage based on the calculated approximate surface of the substrate.

23. A method of moving a stage, comprising the steps of:

moving a stage in a predetermined plane, the stage having an object table that holds an object;

detecting height information of the object held on the object table at a predetermined measurement point; and storing displacement data of the object table in a direction perpendicular to the predetermined plane of the object table produced at the predetermined measurement point when the stage is moved in the predetermined plane corresponding to an object table position in the predetermined plane; and driving the object table relative to the stage based on the stored displacement data and the detected height information.

24. A method of moving the stage according to claim 23, wherein step of driving drives the object table using a plurality of actuators disposed between the stage and object table.

25. An exposure apparatus that forms a pattern of a mask on a substrate through a projection optical system, comprising:

a stage disposed at an image surface side of the projection optical system to be moveable in a predetermined plane;

a table mounted on the stage, the table being able to move relative to the stage, wherein the table holds the substrate;

a reflective surface disposed on the table;

an interferometer communicated with the table to measure a position of the table in the axis of a measuring beam by projecting the measuring beam toward the reflective surface and by receiving the beam reflected therefrom;

a measurement device communicated with the table and the stage to measure a change in relative angle between the stage and the table;

a computation device connected to the measurement device to calculate a change in relative angle between the axis of the measuring beam and the reflective surface based on inclination data of the stage relative to the predetermined plane and the change in the relative angle between the stage and the table measured by the measurement device; and a correction device connected to the computation device to correct a value measured by the interferometer based on the change in the relative angle between the axis of the measuring beam and the reflective surface calculated by the computation device.

26. An exposure apparatus according to claim 25, further comprising a memory connected to the computation device to store the inclination data of the stage, wherein the inclination data of the stage are data of a diagonal distribution of the stage, which have been previously measured with respect to the predetermined plane.

27. An exposure apparatus according to claim 26, wherein the inclination data of the stage are function data of stage coordinates, which are obtained by moving the stage within a movement range thereof while monitoring the outputs of a first level mounted on the stage and a second level mounted on the predetermined plane.

28. An exposure apparatus according to claim 25, further comprising a level mounted on the stage, wherein the inclination data of the stage are calculated based on an output signal from the level.

29. A stage apparatus comprising:

a stage disposed on a base to be moveable in a predetermined plane;

a table mounted on the stage, the table being able to move relative to the stage, wherein the table holds a substrate;

a reflective surface disposed on the table;

an interferometer communicated with the table to measure a position of the table in the axis of a measuring beam by projecting the measuring beam toward the reflective surface and by receiving the beam reflected therefrom;

a measurement device communicated with the table and the stage to measure a change in relative angle between the stage and the table;

a computation device connected to the measurement device to calculate a change in relative angle between the axis of the measuring beam and the reflective surface, based on inclination data of the stage with respect to the predetermined plane and the change in the relative angle between the stage and the table measured by the measurement device; and a correction device connected to the computation device to correct a value measured by the interferometer based on the change in the relative angle between the axis of the measuring beam and the reflective surface calculated by the computation device.

30. A stage apparatus according to claim 29, further comprising a memory connected to the computation device to store the inclination data of the stage, wherein the inclination data of the stage are data of a diagonal distribution of the stage, which have been previously measured with respect to the predetermined plane.

31. A stage apparatus according to claim 29, further comprising a level mounted on the stage, wherein the inclination data of the stage are calculated based on an output signal from the level.

32. A method of moving a stage, comprising the steps of:

moving a stage in a predetermined plane, the stage having a table that holds a substrate and having a reflective surface, wherein the table is able to move relative to the stage;

measuring a position of the table by an interferometer that projects a measuring beam toward the reflective surface and receives the beam reflected therefrom;

measuring a change in relative angle between the stage and the table;

calculating a change in relative angle between the axis of the measuring beam and the reflective surface, based on inclination data of the stage with respect to the predetermined plane and the measured change in the relative angle between the stage and the table; and correcting a value measured by the interferometer based on the change in the relative angle between the axis of the measuring beam and the reflective surface calculated in the step of calculating.

33. An exposure method comprising the step of projecting an image of a mask pattern through a projection optical system onto a substrate that has been positioned by the stage moving method of claim 32.

* * * * *